US007246015B2

(12) United States Patent
Bertness et al.

(10) Patent No.: US 7,246,015 B2
(45) Date of Patent: Jul. 17, 2007

(54) ALTERNATOR TESTER

(75) Inventors: Kevin I. Bertness, Batavia, IL (US);
Alan Keith Melton, Portland, OR (US)

(73) Assignee: Midtronics, Inc., Willowbrook, IL (US)

( * ) Notice: Subject to any disclaimer, the term of this patent is extended or adjusted under 35 U.S.C. 154(b) by 0 days.

(21) Appl. No.: 10/864,904

(22) Filed: Jun. 9, 2004

(65) Prior Publication Data

US 2005/0035752 A1 Feb. 17, 2005

Related U.S. Application Data

(60) Continuation-in-part of application No. 10/098,741, filed on Mar. 14, 2002, now Pat. No. 6,885,195, which is a continuation-in-part of application No. 09/575,629, filed on May 22, 2000, now Pat. No. 6,445,158, which is a continuation-in-part of application No. 09/426,302, filed on Oct. 25, 1999, now Pat. No. 6,091,245, which is a continuation-in-part of application No. 09/293,020, filed on Apr. 16, 1999, now Pat. No. 6,351,102, which is a division of application No. 08/681,730, filed on Jul. 29, 1996, now Pat. No. 6,051,976.

(60) Provisional application No. 60/447,082, filed on Jun. 9, 2003.

(51) Int. Cl.
*G06F 19/00* (2006.01)

(52) U.S. Cl. .................. 702/63; 702/185; 324/426; 324/98; 320/104

(58) Field of Classification Search ................ 320/104, 320/139, 134, 137, 132, 125, 153, 116; 322/22–28, 322/90; 324/426, 427, 428, 430, 435, 436; 701/28–33, 50, 117–118; 340/463, 438, 340/636, 637; 702/63, 185
See application file for complete search history.

(56) References Cited

U.S. PATENT DOCUMENTS

| 2,000,665 A | 5/1935 | Neal ........................ 439/440 |
| 2,514,745 A | 7/1950 | Dalzell ..................... 324/115 |

(Continued)

FOREIGN PATENT DOCUMENTS

DE       29 26 716 B1    1/1981

(Continued)

OTHER PUBLICATIONS

National Semiconductor Corporation, "High Q Notch Filter", 3/69, Linear Brief 5, Mar. 1969.

(Continued)

*Primary Examiner*—Rajnikant B. Patel
(74) *Attorney, Agent, or Firm*—Westman, Champlin & Kelly, P.A.

(57) ABSTRACT

An alternator tester is provided for testing an alternator of a vehicle while the alternator is coupled to the vehicle. A sensor is configured to couple to the vehicle and sense a signal related to operation of the alternator. A memory contains data related to operator instructions for performing an alternator tester of a function of vehicle type. A processor configured to provide an output indication of alternator condition based upon the sensed signal. An extra load or connection can be provided for coupling to the electrical system.

26 Claims, 11 Drawing Sheets

U.S. PATENT DOCUMENTS

| | | | |
|---|---|---|---|
| 3,356,936 A | 12/1967 | Smith | 324/429 |
| 3,562,634 A | 2/1971 | Latner | 324/427 |
| 3,593,099 A | 7/1971 | Scholl | 320/127 |
| 3,607,673 A | 9/1971 | Seyl | 324/425 |
| 3,652,341 A | 3/1972 | Halsall et al. | 20/623.2 |
| 3,676,770 A | 7/1972 | Sharaf et al. | 324/430 |
| 3,729,989 A | 5/1973 | Little | 73/862.192 |
| 3,750,011 A | 7/1973 | Kreps | 324/430 |
| 3,753,094 A | 8/1973 | Furuishi et al. | 324/430 |
| 3,796,124 A | 3/1974 | Crosa | 411/521 |
| 3,808,522 A | 4/1974 | Sharaf | 324/430 |
| 3,811,089 A | 5/1974 | Strezelewicz | 324/170 |
| 3,873,911 A | 3/1975 | Champlin | 324/430 |
| 3,876,931 A | 4/1975 | Godshalk | 324/429 |
| 3,886,443 A | 5/1975 | Miyakawa et al. | 324/426 |
| 3,889,248 A | 6/1975 | Ritter | 340/636 |
| 3,906,329 A | 9/1975 | Bader | 320/134 |
| 3,909,708 A | 9/1975 | Champlin | 324/431 |
| 3,936,744 A | 2/1976 | Perlmutter | 324/772 |
| 3,946,299 A | 3/1976 | Christianson et al. | 320/430 |
| 3,947,757 A | 3/1976 | Grube et al. | 324/416 |
| 3,969,667 A | 7/1976 | McWilliams | 324/427 |
| 3,979,664 A | 9/1976 | Harris | 324/397 |
| 3,984,762 A | 10/1976 | Dowgiallo, Jr. | 324/430 |
| 3,984,768 A | 10/1976 | Staples | 324/712 |
| 3,989,544 A | 11/1976 | Santo | 429/65 |
| 4,008,619 A | 2/1977 | Alcaide et al. | 73/724 |
| 4,023,882 A | 5/1977 | Pettersson | 439/426 |
| 4,024,953 A | 5/1977 | Nailor, III | 206/344 |
| 4,047,091 A | 9/1977 | Hutchines et al. | 363/59 |
| 4,053,824 A | 10/1977 | Dupuis et al. | 324/434 |
| 4,056,764 A | 11/1977 | Endo et al. | 320/101 |
| 4,070,624 A | 1/1978 | Taylor | 324/772 |
| 4,086,531 A | 4/1978 | Bernier | 324/772 |
| 4,112,351 A | 9/1978 | Back et al. | 324/380 |
| 4,114,083 A | 9/1978 | Benham et al. | 320/150 |
| 4,126,874 A | 11/1978 | Suzuki et al. | 396/301 |
| 4,160,916 A | 7/1979 | Papasideris | 307/10.6 |
| 4,178,546 A | 12/1979 | Hulls et al. | 324/772 |
| 4,193,025 A | 3/1980 | Frailing et al. | 324/427 |
| 4,207,611 A * | 6/1980 | Gordon | 701/33 |
| 4,217,645 A | 8/1980 | Barry et al. | 702/63 |
| 4,280,457 A | 7/1981 | Bloxham | 123/198 |
| 4,297,639 A | 10/1981 | Branham | 324/429 |
| 4,315,204 A | 2/1982 | Sievers et al. | 322/28 |
| 4,316,185 A | 2/1982 | Watrous et al. | 320/116 |
| 4,322,685 A | 3/1982 | Frailing et al. | 324/429 |
| 4,351,405 A | 9/1982 | Fields et al. | 180/65.2 |
| 4,352,067 A | 9/1982 | Ottone | 324/434 |
| 4,360,780 A | 11/1982 | Skutch, Jr. | 324/437 |
| 4,361,809 A | 11/1982 | Bil et al. | 324/426 |
| 4,363,407 A | 12/1982 | Buckler et al. | 209/3.3 |
| 4,369,407 A | 1/1983 | Korbell | 324/416 |
| 4,379,989 A | 4/1983 | Kurz et al. | 320/165 |
| 4,379,990 A | 4/1983 | Sievers et al. | 322/99 |
| 4,385,269 A | 5/1983 | Aspinwall et al. | 320/129 |
| 4,390,828 A | 6/1983 | Converse et al. | 320/153 |
| 4,392,101 A | 7/1983 | Saar et al. | 320/156 |
| 4,396,880 A | 8/1983 | Windebank | 320/156 |
| 4,408,157 A | 10/1983 | Beaubien | 324/712 |
| 4,412,169 A | 10/1983 | Dell'Orto | 320/123 |
| 4,423,378 A | 12/1983 | Marino et al. | 324/427 |
| 4,423,379 A | 12/1983 | Jacobs et al. | 324/429 |
| 4,424,491 A | 1/1984 | Bobbett et al. | 324/433 |
| 4,459,548 A | 7/1984 | Lentz et al. | 324/772 |
| 4,514,694 A | 4/1985 | Finger | 324/429 |
| 4,520,353 A | 5/1985 | McAuliffe | 340/636 |
| 4,564,798 A | 1/1986 | Young | 320/103 |
| 4,620,767 A | 11/1986 | Woolf | 439/217 |
| 4,633,418 A | 12/1986 | Bishop | 702/63 |
| 4,637,359 A | 1/1987 | Cook | 123/179 |
| 4,659,977 A | 4/1987 | Kissel et al. | 320/150 |
| 4,663,580 A | 5/1987 | Wortman | 320/153 |
| 4,665,370 A | 5/1987 | Holland | 324/429 |
| 4,667,143 A | 5/1987 | Cooper et al. | 320/153 |
| 4,667,279 A | 5/1987 | Maier | 363/46 |
| 4,678,998 A | 7/1987 | Muramatsu | 324/427 |
| 4,679,000 A | 7/1987 | Clark | 324/428 |
| 4,680,528 A | 7/1987 | Mikami et al. | 320/165 |
| 4,686,442 A | 8/1987 | Radomski | 320/123 |
| 4,697,134 A | 9/1987 | Burkum et al. | 320/134 |
| 4,707,795 A | 11/1987 | Alber et al. | 702/63 |
| 4,709,202 A | 11/1987 | Koenck et al. | 320/112 |
| 4,710,861 A | 12/1987 | Kanner | 363/46 |
| 4,719,428 A | 1/1988 | Liebermann | 324/436 |
| 4,723,656 A | 2/1988 | Kiernan et al. | 206/705 |
| 4,743,855 A | 5/1988 | Randin et al. | 324/430 |
| 4,745,349 A | 5/1988 | Palanisamy et al. | 320/125 |
| 4,816,768 A | 3/1989 | Champlin | 324/428 |
| 4,820,966 A | 4/1989 | Fridman | 320/116 |
| 4,825,170 A | 4/1989 | Champlin | 324/436 |
| 4,847,547 A | 7/1989 | Eng, Jr. et al. | 320/153 |
| 4,849,700 A | 7/1989 | Morioka et al. | 324/427 |
| 4,874,679 A | 10/1989 | Miyagawa | 429/91 |
| 4,876,495 A | 10/1989 | Palanisamy et al. | 320/106 |
| 4,881,038 A | 11/1989 | Champlin | 324/426 |
| 4,888,716 A | 12/1989 | Ueno | 702/63 |
| 4,907,176 A * | 3/1990 | Bahnick et al. | 701/29 |
| 4,912,416 A | 3/1990 | Champlin | 324/430 |
| 4,913,116 A | 4/1990 | Katogi et al. | 123/406.32 |
| 4,926,330 A | 5/1990 | Abe et al. | 364/424.03 |
| 4,929,931 A | 5/1990 | McCuen | 340/636 |
| 4,931,738 A | 6/1990 | MacIntyre et al. | 324/435 |
| 4,933,845 A | 6/1990 | Hayes | 710/104 |
| 4,934,957 A | 6/1990 | Bellusci | 439/504 |
| 4,937,528 A | 6/1990 | Palanisamy | 324/430 |
| 4,947,124 A | 8/1990 | Hauser | 324/430 |
| 4,949,046 A | 8/1990 | Seyfang | 324/427 |
| 4,956,597 A | 9/1990 | Heavey et al. | 320/129 |
| 4,968,941 A | 11/1990 | Rogers | 324/428 |
| 4,968,942 A | 11/1990 | Palanisamy | 324/430 |
| 5,004,979 A | 4/1991 | Marino et al. | 324/160 |
| 5,032,825 A | 7/1991 | Kuznicki | 340/636 |
| 5,034,893 A * | 7/1991 | Fisher | 701/99 |
| 5,037,778 A | 8/1991 | Stark et al. | 437/216 |
| 5,047,722 A | 9/1991 | Wurst et al. | 324/430 |
| 5,081,565 A | 1/1992 | Nabha et al. | 362/465 |
| 5,087,881 A | 2/1992 | Peacock | 324/378 |
| 5,095,223 A | 3/1992 | Thomas | 307/110 |
| 5,108,320 A | 4/1992 | Kimber | 439/883 |
| 5,126,675 A | 6/1992 | Yang | 324/435 |
| 5,140,269 A | 8/1992 | Champlin | 324/433 |
| 5,144,218 A | 9/1992 | Bosscha | 320/139 |
| 5,144,248 A | 9/1992 | Alexandres et al. | 324/428 |
| 5,159,272 A | 10/1992 | Rao et al. | 324/429 |
| 5,160,881 A | 11/1992 | Schramm et al. | 322/7 |
| 5,168,208 A * | 12/1992 | Schultz et al. | 322/25 |
| 5,170,124 A | 12/1992 | Blair et al. | 324/434 |
| 5,179,335 A | 1/1993 | Nor | 320/159 |
| 5,194,799 A | 3/1993 | Tomantschger | 320/103 |
| 5,204,611 A | 4/1993 | Nor et al. | 320/145 |
| 5,214,370 A | 5/1993 | Harm et al. | 320/152 |
| 5,214,385 A | 5/1993 | Gabriel et al. | 324/434 |
| 5,241,275 A | 8/1993 | Fang | 324/430 |
| 5,254,952 A | 10/1993 | Salley et al. | 324/429 |
| 5,266,880 A | 11/1993 | Newland | 320/125 |
| 5,281,919 A | 1/1994 | Palanisamy | 324/427 |
| 5,281,920 A | 1/1994 | Wurst | 324/430 |
| 5,295,078 A | 3/1994 | Stich et al. | 320/136 |
| 5,298,797 A | 3/1994 | Redl | 327/387 |
| 5,300,874 A | 4/1994 | Shimamoto et al. | 320/106 |
| 5,302,902 A | 4/1994 | Groehl | 324/434 |
| 5,313,152 A | 5/1994 | Wozniak et al. | 320/118 |
| 5,315,287 A | 5/1994 | Sol | 340/455 |

| Patent No. | Date | Inventor | Class |
|---|---|---|---|
| 5,321,626 A | 6/1994 | Palladino | 702/63 |
| 5,321,627 A | 6/1994 | Reher | 364/483 |
| 5,323,337 A | 6/1994 | Wilson et al. | 364/574 |
| 5,325,041 A | 6/1994 | Briggs | 320/149 |
| 5,331,268 A | 7/1994 | Patino et al. | 320/158 |
| 5,336,993 A | 8/1994 | Thomas et al. | 324/158.1 |
| 5,338,515 A | 8/1994 | Dalla Betta et al. | 422/95 |
| 5,339,018 A | 8/1994 | Brokaw | 320/147 |
| 5,343,380 A | 8/1994 | Champlin | 363/46 |
| 5,347,163 A | 9/1994 | Yoshimura | 307/66 |
| 5,352,968 A | 10/1994 | Reni et al. | 320/136 |
| 5,357,519 A | 10/1994 | Martin et al. | 371/15.1 |
| 5,365,160 A | 11/1994 | Leppo et al. | 320/160 |
| 5,365,453 A | 11/1994 | Startup et al. | 320/136 |
| 5,369,364 A | 11/1994 | Renirie et al. | 324/430 |
| 5,381,096 A | 1/1995 | Hirzel | 324/427 |
| 5,410,754 A | 4/1995 | Klotzbach et al. | 370/466 |
| 5,412,308 A | 5/1995 | Brown | 323/267 |
| 5,412,323 A | 5/1995 | Kato et al. | 324/429 |
| 5,426,371 A | 6/1995 | Salley et al. | 324/429 |
| 5,426,416 A | 6/1995 | Jefferies et al. | 340/664 |
| 5,432,025 A | 7/1995 | Cox | 429/65 |
| 5,432,426 A | 7/1995 | Yoshida | 320/160 |
| 5,434,495 A | 7/1995 | Toko | 320/135 |
| 5,435,185 A | 7/1995 | Eagan | 73/587 |
| 5,442,274 A | 8/1995 | Tamai | 320/146 |
| 5,445,026 A | 8/1995 | Eagan | 73/591 |
| 5,449,996 A | 9/1995 | Matsumoto et al. | 320/148 |
| 5,449,997 A | 9/1995 | Gilmore et al. | 320/148 |
| 5,451,881 A | 9/1995 | Finger | 324/429 |
| 5,453,027 A | 9/1995 | Buell et al. | 439/433 |
| 5,457,377 A | 10/1995 | Jonsson | 320/DIG. 21 |
| 5,469,043 A | 11/1995 | Cherng et al. | 320/161 |
| 5,485,090 A | 1/1996 | Stephens | 324/433 |
| 5,488,300 A | 1/1996 | Jamieson | 324/432 |
| 5,504,674 A * | 4/1996 | Chen et al. | 705/4 |
| 5,519,383 A | 5/1996 | De La Rosa | 340/636 |
| 5,528,148 A | 6/1996 | Rogers | 320/137 |
| 5,537,967 A | 7/1996 | Tashiro et al. | 123/192.1 |
| 5,541,489 A | 7/1996 | Dunstan | 320/134 |
| 5,546,317 A | 8/1996 | Andrieu | 702/63 |
| 5,548,273 A | 8/1996 | Nicol et al. | 340/439 |
| 5,550,485 A | 8/1996 | Falk | 324/772 |
| 5,561,380 A | 10/1996 | Sway-Tin et al. | 324/509 |
| 5,562,501 A | 10/1996 | Kinoshita et al. | 439/852 |
| 5,563,496 A | 10/1996 | McClure | 320/128 |
| 5,572,136 A | 11/1996 | Champlin | 324/426 |
| 5,574,355 A | 11/1996 | McShane et al. | 320/161 |
| 5,578,915 A | 11/1996 | Crouch, Jr. et al. | 324/428 |
| 5,583,416 A | 12/1996 | Klang | 320/160 |
| 5,585,728 A | 12/1996 | Champlin | 324/427 |
| 5,589,757 A | 12/1996 | Klang | 320/160 |
| 5,592,093 A | 1/1997 | Klingbiel | 324/426 |
| 5,592,094 A | 1/1997 | Ichikawa | 324/427 |
| 5,596,260 A | 1/1997 | Moravec et al. | 320/135 |
| 5,598,098 A | 1/1997 | Champlin | 324/430 |
| 5,602,462 A | 2/1997 | Stich et al. | 323/258 |
| 5,606,242 A | 2/1997 | Hull et al. | 320/106 |
| 5,614,788 A | 3/1997 | Mullins et al. | 315/82 |
| 5,621,298 A | 4/1997 | Harvey | 320/134 |
| 5,633,985 A | 5/1997 | Severson et al. | 704/267 |
| 5,637,978 A | 6/1997 | Kellett et al. | 320/104 |
| 5,642,031 A | 6/1997 | Brotto | 320/152 |
| 5,650,937 A | 7/1997 | Bounaga | 702/6 |
| 5,652,501 A | 7/1997 | McClure et al. | 320/118 |
| 5,653,659 A | 8/1997 | Kunibe et al. | 477/111 |
| 5,654,623 A | 8/1997 | Shiga et al. | 320/106 |
| 5,656,920 A | 8/1997 | Cherng et al. | 320/161 |
| 5,661,368 A | 8/1997 | Deol et al. | 315/82 |
| 5,675,234 A | 10/1997 | Greene | 320/DIG. 18 |
| 5,677,077 A | 10/1997 | Faulk | 429/90 |
| 5,699,050 A | 12/1997 | Kanazawa | 340/636 |
| 5,701,089 A | 12/1997 | Perkins | 324/772 |
| 5,705,929 A | 1/1998 | Caravello et al. | 324/430 |
| 5,707,015 A | 1/1998 | Guthrie | 241/120 |
| 5,710,503 A | 1/1998 | Sideris et al. | 320/116 |
| 5,711,648 A | 1/1998 | Hammerslag | 414/800 |
| 5,717,336 A | 2/1998 | Basell et al. | 324/430 |
| 5,717,937 A | 2/1998 | Fritz | 320/128 |
| 5,739,667 A | 4/1998 | Matsuda et al. | 320/128 |
| 5,745,044 A | 4/1998 | Hyatt, Jr. et al. | 340/5.23 |
| 5,747,909 A | 5/1998 | Syverson et al. | 310/156.56 |
| 5,747,967 A | 5/1998 | Muljadi et al. | 320/148 |
| 5,754,417 A | 5/1998 | Nicollini | 363/60 |
| 5,757,192 A | 5/1998 | McShane et al. | 324/427 |
| 5,760,587 A | 6/1998 | Harvey | 324/434 |
| 5,772,468 A | 6/1998 | Kowalski et al. | 439/506 |
| 5,773,978 A | 6/1998 | Becker | 324/430 |
| 5,780,974 A | 7/1998 | Pabla et al. | 315/82 |
| 5,780,980 A | 7/1998 | Naito | 318/139 |
| 5,789,899 A | 8/1998 | van Phuoc et al. | 320/112 |
| 5,793,359 A | 8/1998 | Ushikubo | 345/169 |
| 5,796,239 A | 8/1998 | van Phuoc et al. | 320/107 |
| 5,808,469 A | 9/1998 | Kopera | 324/434 |
| 5,818,234 A | 10/1998 | McKinnon | 324/433 |
| 5,821,756 A | 10/1998 | McShane et al. | 324/430 |
| 5,821,757 A | 10/1998 | Alvarez et al. | 324/434 |
| 5,825,174 A | 10/1998 | Parker | 324/106 |
| 5,831,435 A | 11/1998 | Troy | 324/426 |
| 5,850,113 A | 12/1998 | Weimer et al. | 307/125 |
| 5,862,515 A | 1/1999 | Kobayashi et al. | 702/63 |
| 5,865,638 A | 2/1999 | Trafton | 439/288 |
| 5,872,443 A | 2/1999 | Williamson | 320/160 |
| 5,872,453 A | 2/1999 | Shimoyama et al. | 324/431 |
| 5,895,440 A | 4/1999 | Proctor et al. | 702/63 |
| 5,912,534 A | 6/1999 | Benedict | 315/82 |
| 5,914,605 A | 6/1999 | Bertness | 324/430 |
| 5,927,938 A | 7/1999 | Hammerslag | 414/809 |
| 5,929,609 A | 7/1999 | Joy et al. | 322/25 |
| 5,939,855 A | 8/1999 | Proctor et al. | 320/104 |
| 5,939,861 A | 8/1999 | Joko et al. | 320/122 |
| 5,945,829 A | 8/1999 | Bertness | 324/430 |
| 5,951,229 A | 9/1999 | Hammerslag | 414/398 |
| 5,961,561 A | 10/1999 | Wakefield, II | 701/29 |
| 5,961,604 A | 10/1999 | Anderson et al. | 709/229 |
| 5,969,625 A | 10/1999 | Russo | 340/636.19 |
| 5,978,805 A | 11/1999 | Carson | 707/10 |
| 5,982,138 A | 11/1999 | Krieger | 320/105 |
| 6,002,238 A | 12/1999 | Champlin | 320/134 |
| 6,005,759 A | 12/1999 | Hart et al. | 361/66 |
| 6,008,652 A | 12/1999 | Theofanopoulos et al. | 324/434 |
| 6,009,369 A | 12/1999 | Boisvert et al. | 701/99 |
| 6,016,047 A | 1/2000 | Notten et al. | 320/137 |
| 6,031,354 A | 2/2000 | Wiley et al. | 320/116 |
| 6,031,368 A | 2/2000 | Klippel et al. | 324/133 |
| 6,037,749 A | 3/2000 | Parsonage | 320/132 |
| 6,037,751 A | 3/2000 | Klang | 320/160 |
| 6,037,777 A | 3/2000 | Champlin | 324/430 |
| 6,037,778 A | 3/2000 | Makhija | 324/433 |
| 6,046,514 A | 4/2000 | Rouillard et al. | 307/77 |
| 6,051,976 A | 4/2000 | Bertness | 324/426 |
| 6,055,468 A | 4/2000 | Kaman et al. | 701/29 |
| 6,061,638 A | 5/2000 | Joyce | 702/63 |
| 6,064,372 A | 5/2000 | Kahkoska | 345/173 |
| 6,072,299 A | 6/2000 | Kurle et al. | 320/112 |
| 6,072,300 A | 6/2000 | Tsuji | 320/116 |
| 6,081,098 A | 6/2000 | Bertness et al. | 320/134 |
| 6,081,109 A | 6/2000 | Seymour et al. | 324/127 |
| 6,091,238 A | 7/2000 | McDermott | 324/207.2 |
| 6,091,245 A | 7/2000 | Bertness | 324/426 |
| 6,094,033 A | 7/2000 | Ding et al. | 320/132 |
| 6,100,670 A | 8/2000 | Levesque | 320/150 |
| 6,104,167 A | 8/2000 | Bertness et al. | 320/132 |
| 6,114,834 A | 9/2000 | Parise | 320/109 |
| 6,137,269 A | 10/2000 | Champlin | 320/150 |
| 6,140,797 A | 10/2000 | Dunn | 320/105 |

| | | | |
|---|---|---|---|
| 6,144,185 A | 11/2000 | Dougherty et al. | 320/132 |
| 6,150,793 A | 11/2000 | Lesesky et al. | 320/104 |
| 6,158,000 A | 12/2000 | Collins | 713/1 |
| 6,161,640 A | 12/2000 | Yamaguchi | 180/65.8 |
| 6,163,156 A | 12/2000 | Bertness | 324/426 |
| 6,167,349 A | 12/2000 | Alvarez | 702/63 |
| 6,172,483 B1 | 1/2001 | Champlin | 320/134 |
| 6,172,505 B1 | 1/2001 | Bertness | 324/430 |
| 6,181,545 B1 | 1/2001 | Amatucci et al. | 361/502 |
| 6,211,651 B1 | 4/2001 | Nemoto | 320/133 |
| 6,215,275 B1 | 4/2001 | Bean | 320/106 |
| 6,222,342 B1 | 4/2001 | Eggert et al. | 320/105 |
| 6,222,369 B1 | 4/2001 | Champlin | 324/430 |
| D442,503 S | 5/2001 | Lundbeck et al. | D10/77 |
| 6,225,808 B1 | 5/2001 | Varghese et al. | 324/426 |
| 6,236,332 B1 | 5/2001 | Conkright et al. | 340/3.1 |
| 6,238,253 B1 | 5/2001 | Qualls | 439/759 |
| 6,242,887 B1 | 6/2001 | Burke | 320/104 |
| 6,249,124 B1 | 6/2001 | Bertness | 324/426 |
| 6,250,973 B1 | 6/2001 | Lowery et al. | 439/763 |
| 6,254,438 B1 | 7/2001 | Gaunt | 439/755 |
| 6,259,170 B1 | 7/2001 | Limoge et al. | 307/10.8 |
| 6,259,254 B1 | 7/2001 | Klang | 324/427 |
| 6,262,563 B1 | 7/2001 | Champlin | 320/134 |
| 6,263,268 B1 | 7/2001 | Nathanson | 701/29 |
| 6,271,643 B1 | 8/2001 | Becker et al. | 320/112 |
| 6,275,008 B1 | 8/2001 | Arai et al. | 320/132 |
| 6,294,896 B1 | 9/2001 | Champlin | 320/134 |
| 6,294,897 B1 | 9/2001 | Champlin | 320/153 |
| 6,304,087 B1 | 10/2001 | Bertness | 324/426 |
| 6,307,349 B1 | 10/2001 | Koenck et al. | 320/112 |
| 6,310,481 B2 | 10/2001 | Bertness | 324/430 |
| 6,313,607 B1 | 11/2001 | Champlin | 320/132 |
| 6,313,608 B1 | 11/2001 | Varghese et al. | 32/132 |
| 6,316,914 B1 | 11/2001 | Bertness | 320/134 |
| 6,323,650 B1 | 11/2001 | Bertness et al. | 324/426 |
| 6,329,793 B1 | 12/2001 | Bertness et al. | 320/132 |
| 6,331,762 B1 | 12/2001 | Bertness | 320/134 |
| 6,332,113 B1 | 12/2001 | Bertness | 702/63 |
| 6,346,795 B2 | 2/2002 | Haraguchi et al. | 320/136 |
| 6,347,958 B1 | 2/2002 | Tsai | 439/488 |
| 6,351,102 B1 | 2/2002 | Troy | 320/139 |
| 6,356,042 B1 | 3/2002 | Kahlon et al. | 318/138 |
| 6,359,441 B1 | 3/2002 | Bertness | 324/426 |
| 6,359,442 B1 | 3/2002 | Henningson et al. | 324/426 |
| 6,363,303 B1 | 3/2002 | Bertness | 701/29 |
| RE37,677 E | 4/2002 | Irie | 315/83 |
| 6,384,608 B1 | 5/2002 | Namaky | 324/430 |
| 6,388,448 B1 | 5/2002 | Cervas | 324/426 |
| 6,392,414 B2 | 5/2002 | Bertness | 324/429 |
| 6,396,278 B1 | 5/2002 | Makhija | 324/402 |
| 6,411,098 B1 | 6/2002 | Laletin | 324/436 |
| 6,417,669 B1 | 7/2002 | Champlin | 324/426 |
| 6,424,157 B1 | 7/2002 | Gollomp et al. | 324/430 |
| 6,424,158 B2 | 7/2002 | Klang | 324/433 |
| 6,441,585 B1 | 8/2002 | Bertness | 320/132 |
| 6,445,158 B1 | 9/2002 | Bertness et al. | 320/104 |
| 6,456,045 B1 | 9/2002 | Troy et al. | 320/139 |
| 6,466,025 B1 | 10/2002 | Klang | 324/429 |
| 6,466,026 B1 | 10/2002 | Champlin | 324/430 |
| 6,495,990 B2 | 12/2002 | Champlin | 320/132 |
| 6,526,361 B1 | 2/2003 | Jones et al. | 702/63 |
| 6,531,848 B1 | 3/2003 | Chitsazan et al. | 320/153 |
| 6,534,993 B2 | 3/2003 | Bertness | 324/433 |
| 6,544,078 B2 | 4/2003 | Palmisano et al. | 439/762 |
| 6,556,019 B2 | 4/2003 | Bertness | 324/426 |
| 6,566,883 B1 | 5/2003 | Vonderhaar et al. | 324/426 |
| 6,570,385 B1 | 5/2003 | Roberts et al. | 324/378 |
| 6,586,941 B2 | 7/2003 | Bertness et al. | 324/426 |
| 6,597,150 B1 | 7/2003 | Bertness et al. | 320/104 |
| 6,600,815 B1 | 7/2003 | Walding | 379/93.07 |
| 6,618,644 B2 | 9/2003 | Bean | 700/231 |
| 6,628,011 B2 | 9/2003 | Droppo et al. | 307/43 |
| 6,629,054 B2 | 9/2003 | Makhija et al. | 702/113 |
| 6,667,624 B1 | 12/2003 | Raichle et al. | 324/522 |
| 6,679,212 B2 | 1/2004 | Kelling | 123/179.28 |
| 6,777,945 B2 | 8/2004 | Roberts et al. | 324/426 |
| 2002/0010558 A1 | 1/2002 | Bertness et al. | 702/63 |
| 2002/0030495 A1 | 3/2002 | Kechmire | 324/427 |
| 2002/0050163 A1 | 5/2002 | Makhija et al. | 73/116 |
| 2002/0171428 A1 | 11/2002 | Bertness | 324/426 |
| 2002/0176010 A1 | 11/2002 | Wallach et al. | 348/362 |
| 2003/0025481 A1 | 2/2003 | Bertness | 324/426 |
| 2003/0036909 A1 | 2/2003 | Kato | 704/275 |
| 2003/0184262 A1 | 10/2003 | Makhija | 320/130 |
| 2003/0184306 A1 | 10/2003 | Bertness et al. | 324/426 |
| 2004/0000590 A1 | 1/2004 | Raichle et al. | 235/462.01 |
| 2004/0000891 A1 | 1/2004 | Raichle et al. | 320/107 |
| 2004/0000893 A1 | 1/2004 | Raichle et al. | 320/135 |
| 2004/0000913 A1 | 1/2004 | Raichle et al. | 324/426 |
| 2004/0000915 A1 | 1/2004 | Raichle et al. | 324/522 |
| 2004/0002824 A1 | 1/2004 | Raichle et al. | 702/63 |
| 2004/0002825 A1 | 1/2004 | Raichle et al. | 702/63 |
| 2004/0002836 A1 | 1/2004 | Raichle et al. | 702/188 |
| 2004/0049361 A1 | 3/2004 | Hamdan et al. | 702/115 |
| 2004/0051533 A1 | 3/2004 | Namaky | 324/426 |
| 2004/0054503 A1 | 3/2004 | Namaky | 702/183 |

FOREIGN PATENT DOCUMENTS

| | | |
|---|---|---|
| EP | 0 022 450 A1 | 1/1981 |
| EP | 0 637 754 A1 | 2/1995 |
| EP | 0 772 056 A1 | 5/1997 |
| FR | 2 749 397 | 12/1997 |
| GB | 2 088 159 A | 6/1982 |
| GB | 2 246 916 A | 10/1990 |
| GB | 2 387 235 A | 10/2003 |
| JP | 59-17892 | 1/1984 |
| JP | 59-17893 | 1/1984 |
| JP | 59-17894 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04095788 | 3/1992 |
| JP | 04131779 | 5/1992 |
| JP | 04372536 | 12/1992 |
| JP | 5216550 | 8/1993 |
| JP | 7-128414 | 5/1995 |
| JP | 09061505 | 3/1997 |
| JP | 10056744 | 2/1998 |
| JP | 10232273 | 9/1998 |
| JP | 11103503 A | 4/1999 |
| RU | 2089015 C1 | 8/1997 |
| WO | WO 93/22666 | 11/1993 |
| WO | WO 94/05069 | 3/1994 |
| WO | WO 97/44652 | 11/1997 |
| WO | WO 98/04910 | 2/1998 |
| WO | WO 98/58270 | 12/1998 |
| WO | WO 99/23738 | 5/1999 |
| WO | WO 00/16083 | 3/2000 |
| WO | WO 00/62049 | 10/2000 |
| WO | WO 00/67359 | 11/2000 |
| WO | WO 01/59443 | 2/2001 |
| WO | WO 00/16614 A1 | 3/2001 |
| WO | WO 00/16615 A1 | 3/2001 |
| WO | WO 01/51947 | 7/2001 |

OTHER PUBLICATIONS

Burr-Brown Corporation, "Design A 60 Hz Notch Filter with the UAF42", 1/94, AB-071, 1994.

National Semiconductor Corporation, "LMF90-4$^{th}$-Order Elliptic Notch Filter", 12/94, RRD-B30M115, Dec. 1994.

"Notification of Transmittal of The International Search Report or the Declaration", PCT/US02/29461.

"Electrochemical Impedance Spectroscopy in Battery Development and Testing", *Batteries International*, Apr. 1997, pp. 59 and 62-63.

"Battery Impedance", by E. Willihnganz et al., *Electrical Engineering*, Sep. 1959, pp. 922-925.

"Determining The End of Battery Life", by S. DeBardelaben, *IEEE*, 1986, pp. 365-368.

"A Look at the Impedance of a Cell", by S. Debardelaben, *IEEE*, 1988, pp. 394-397.

"The Impedance of Electrical Storage Cells", by N.A. Hampson et al., *Journal of Applied Electrochemistry*, 1980, pp. 3-11.

"A Package for Impedance/Admittance Data Analysis", by B. Boukamp, *Solid State Ionics*, 1986, pp. 136-140.

"Precision of Impedance Spectroscopy Estimates of Bulk, Reaction Rate, and Diffusion Parameters", by J. Macdonald et al., *J. Electroanal, Chem.*, 1991, pp. 1-11.

Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128, 131.

IEEE Recommended Practice For Maintenance, Testings, and Replacement of Large Lead Storage Batteries for Generating Stations and Substations, *The Institute of Electrical and Electronics Engineers, Inc., ANSI/IEEE Std.* 450-1987, Mar. 9, 1987, pp. 7-15.

"Field and Laboratory Studies to Assess the State of Health of Valve-Regulated Lead Acid Batteries: Part I Conductance/Capacity Correlation Studies", by D. Feder et al., *IEEE*, Aug. 1992, pp. 218-233.

"JIS Japanese Industrial Standard-Lead Acid Batteries for Automobiles", *Japanese Standards Association UDC*, 621.355.2:629.113.006, Nov. 1995.

"Professional BCS System Analyzer" 2001.

"Performance of Dry Cells", by C. Hambuechen, Preprint of *Am. Electrochem. Soc.*, Apr. 18-20, 1912, paper No. 19, pp. 1-5.

"A Bridge for Measuring Storage Battery Resistance", by E. Willihncanz, *The Electrochemical Society*, preprint 79-20, Apr. 1941, pp. 253-258.

"Alligator Clips with Wire Penetrators" *J.S. Popper, Inc.* product information, downloaded from http://www.jspopper.com/, undated.

"#12: LM78S40 Simple Switcher DC to DC Converter", *ITM e-Catalog*, downloaded from http://www.pcbcafe.com, undated.

"Simple DC-DC Converts Allows Use of Single Battery", *Electronix Express*, downloaded from http://www.elexp.com/t_dc-dc.htm, undated.

"DC-DC Converter Basics", *Power Designers*, downloaded from http://www.powederdesigners.com/InforWeb.design_center/articles/DC-DC/converter.shtm, undated.

"Notification of Transmittal of The International Search Report or the Declaration", PCT/US03/06577.

"Notification of Transmittal of The International Search Report or the Declaration", PCT/US03/07837.

"Notification of Transmittal of The International Search Report or the Declaration", PCT/US03/41561.

"Notification of Transmittal of The International Search Report or the Declaration", PCT/US03/27696.

"Programming Training Course, 62-000 Series Smart Engine Analyzer", Testproducts Division, Kalamazoo, Michigan, pp. 1-207, (1984).

"Operators Manual, Modular Computer Analyzer Model MCA 3000", Sun Electric Corporation, Crystal Lake, Illinois, pp. 1-1-14-13, (1991).

Mauracher et al., P., "Dynamic modelling of lead/acid batteries using impedance spectroscopy for parameter identification", Journal of Power Sources 67, pp. 69-84, 1997.

Huet, F., "A review of impedance measurements for determination of the state-of-charge or state-of-health of secondary batteries", Journal of Power Soureces 70, pp. 59-69, 1998.

Atwater et al., T., "Improved Impedance Spectroscopy Technique for Status Determination of Production Li/SO$_2$ Batteries", pp. 110-113, 1992.

"Dynamic modelling of lead/acid batteries using impedance spectroscopy for parameter identification", Journal of Power Sources, pp. 69-84, (1997).

"A review of impedance measurements for determination of the state-of-charge or state-of-health of secondary batteries", Journal of Power Sources, pp. 59-69, (1998).

"Improved Impedance Spectroscopy Technique For Status Determination of Production Li/SO$_2$ Batteries" Terrill Atwater et al., pp. 10-113, (1992).

"Search Report Under Section 17" for Great Britain Application No. GB0421447.7. (Jan. 28, 2005).

"Results of Discrete Frequency Immittance Spectroscopy (DFIS) Measurements of Lead Acid Batteries", by K.S. Champlin et al., *Proceedings of 23$^{rd}$ International Teleco Conference (INTELEC)*, published Oct. 2001, IEE, pp. 433-440.

"Examination Report" from the U.K. Patent Office for U.K. Appl. No. 0417678.0.

* cited by examiner

ALTERNATOR TESTER

BACKGROUND OF THE INVENTION

The present application is based on and claims the benefit of U.S. provisional patent application Ser. No. 60/477,082, filed Jun. 9, 2003, the present application is a Continuation-In-Part of and claims priority of U.S. patent application Ser. No. 10/098,741, filed Mar. 14, 2002, now U.S. Pat. No. 6,885,195 which is a Continuation-In-Part of U.S. patent application Ser. No. 09/575,629, filed May 22, 2000, now U.S. Pat. No. 6,445,158, which is a Continuation-In-Part of Ser. No. 09/293,020, filed Apr. 16, 1999, now U.S. Pat. No. 6,351,102; which is a Continuation-In-Part of Ser. No. 09/426,302, filed Oct. 25, 1999, now U.S. Pat. No. 6,091,245; which is a Divisional of Ser. No. 08/681,730, filed Jul. 29, 1996, now U.S. Pat. No. 6,051,976, the content of which is hereby incorporated by reference in its entirety.

The present invention relates to devices for testing an automotive vehicle. More specifically, the present invention relates to a battery charging system tester for an automotive vehicle.

Automotive vehicles include a storage battery for operating electronics in the vehicle and using an electric starter to start the vehicle engine. A battery charging system is coupled to the engine and is powered by the engine when the vehicle is running. The charging system is used to charge the storage battery when the vehicle is operating.

Many attempts have been made to test the battery of the vehicle. One technique which has been pioneered by Dr. Keith S. Champlin and Midtronics, Inc. of Burr Ridge, Ill. relates to measuring the conductance of batteries to determine their condition. This technique and other inventions are described in a number of United States patents, for example, U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME-VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER DEVICE; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE; U.S. Pat. No. 5,585,416, issued Dec. 10, 1996, entitled APPARATUS AND METHOD FOR STEP-CHARGING BATTERIES TO OPTIMIZE CHARGE ACCEPTANCE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,589,757, issued Dec. 31, 1996, entitled APPARATUS AND METHOD FOR STEP-CHARGING BATTERIES TO OPTIMIZE CHARGE ACCEPTANCE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,656,920, issued Aug. 12, 1997, entitled METHOD FOR OPTIMIZING THE CHARGING LEAD-ACID BATTERIES AND AN INTERACTIVE CHARGER; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF CHARGE; U.S. Pat. No. 5,831,435, issued Nov. 3, 1998, entitled BATTERY TESTER FOR JIS STANDARD; U.S. Pat. No. 5,871,858, issued February. 16, 1999, entitled ANTI-THEFT BATTERY; U.S. Pat. No. 5,914,605, issued Jun. 22, 1999, entitled ELECTRONIC BATTERY TESTER; U.S. Pat. No. 5,945,829, issued Aug. 31, 1999, entitled MIDPOINT BATTERY MONITORING; U.S. Pat. No. 6,002,238, issued Dec. 14, 1999, entitled METHOD AND APPARATUS FOR MEASURING COMPLEX IMPEDANCE OF CELLS AND BATTERIES; U.S. Pat. No. 6,037,751, issued Mar. 14, 2000, entitled APPARATUS FOR CHARGING BATTERIES; U.S. Pat. No. 6,037,777, issued Mar. 14, 2000, entitled METHOD AND APPARATUS FOR DETERMINING BATTERY PROPERTIES FROM COMPLEX IMPEDANCE/ADMITTANCE; U.S. Pat. No. 6,051,976, issued Apr. 18, 2000, entitled METHOD AND APPARATUS FOR AUDITING A BATTERY TEST; U.S. Pat. No. 6,081,098, issued Jun. 27, 2000, entitled METHOD AND APPARATUS FOR CHARGING A BATTERY; U.S. Pat. No. 6,091,245, issued Jul. 18, 2000, entitled METHOD AND APPARATUS FOR AUDITING A BATTERY TEST; U.S. Pat. No. 6,104,167, issued Aug. 15, 2000, entitled METHOD AND APPARATUS FOR CHARGING A BATTERY; U.S. Pat. No. 6,137,269, issued Oct. 24, 2000, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,163,156, issued Dec. 19, 2000, entitled ELECTRICAL CONNECTION FOR ELECTRONIC BATTERY TESTER; U.S. Pat. No. 6,172,483, issued Jan. 9, 2001, entitled METHOD AND APPARATUS FOR MEASURING COMPLEX IMPEDANCE OF CELLS AND BATTERIES; U.S. Pat. No. 6,172,505, issued Jan. 9, 2001, entitled ELECTRONIC BATTERY TESTER; U.S. Pat. No. 6,222,369, issued Apr. 24, 2001, entitled METHOD AND APPARATUS FOR DETERMINING BATTERY PROPERTIES FROM COMPLEX IMPEDANCE/ADMITTANCE; U.S. Pat. No. 6,225,808, issued May 1, 2001, entitled TEST COUNTER FOR ELECTRONIC BATTERY TESTER; U.S. Pat. No. 6,249,124, issued Jun. 19, 2001, entitled ELECTRONIC BATTERY TESTER WITH INTERNAL BATTERY; U.S. Pat. No. 6,259,254, issued Jul. 10, 2001, entitled APPARATUS AND METHOD FOR CARRYING OUT DIAGNOSTIC TESTS ON BATTERIES AND FOR RAPIDLY CHARGING BATTERIES; U.S. Pat. No. 6,262,563, issued Jul. 17, 2001, entitled METHOD AND APPARATUS FOR MEASURING COMPLEX ADMITTANCE OF CELLS AND BATTERIES; U.S. Pat. No. 6,294,896, issued Sep. 25, 2001; entitled METHOD AND APPARATUS FOR MEASURING COMPLEX SELF-IMMITANCE OF A GENERAL ELECTRI- CAL ELEMENT; U.S. Pat. No. 6,294,897, issued Sep. 25, 2001, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,304,087, issued Oct. 16, 2001, entitled APPARATUS FOR CALIBRATING ELECTRONIC BATTERY TESTER; U.S. Pat. No. 6,310,481, issued Oct. 30, 2001, entitled ELECTRONIC BATTERY TESTER; U.S. Pat. No. 6,313,607, issued Nov. 6, 2001, entitled METHOD AND APPARATUS FOR EVALUATING STORED CHARGE IN AN ELECTROCHEMICAL CELL OR BATTERY; U.S. Pat. No. 6,313,608, issued Nov. 6, 2001, entitled METHOD AND APPARATUS FOR CHARGING A BATTERY; U.S. Pat. No. 6,316,914, issued Nov. 13, 2001, entitled TESTING PARALLEL STRINGS OF STORAGE BATTERIES; U.S. Pat. No. 6,323,650, issued Nov. 27, 2001, entitled ELECTRONIC BATTERY TESTER; U.S. Pat. No. 6,329,793, issued Dec. 11, 2001, entitled METHOD AND APPARATUS FOR CHARGING A BATTERY; U.S. Pat. No. 6,331,762, issued Dec. 18, 2001, entitled ENERGY MANAGEMENT SYSTEM FOR AUTOMOTIVE VEHICLE; U.S. Pat. No. 6,332,113, issued Dec. 18, 2001, entitled ELECTRONIC BATTERY TESTER; U.S. Pat. No. 6,351,102, issued Feb. 26, 2002, entitled AUTOMOTIVE BATTERY CHARGING SYSTEM TESTER; U.S. Pat. No. 6,359,441, issued Mar. 19, 2002, entitled ELECTRONIC BATTERY TESTER; U.S. Pat. No. 6,363,303, issued Mar. 26, 2002, entitled ALTERNATOR DIAGNOSTIC SYSTEM; U.S. Pat. No. 6,377,031, issued Apr. 23, 2002, entitled INTELLIGENT SWITCH FOR POWER MANAGEMENT; U.S. Pat. No. 6,392,414, issued May 21, 2002, entitled ELECTRONIC BATTERY TESTER; U.S. Pat. No. 6,417,669, issued Jul. 9, 2002, entitled SUPPRESSING INTERFERENCE IN AC MEASUREMENTS OF CELLS, BATTERIES AND OTHER ELECTRICAL ELEMENTS; U.S. Pat. No. 6,424,158, issued Jul. 23, 2002, entitled APPARATUS AND METHOD FOR CARRYING OUT DIAGNOSTIC TESTS ON BATTERIES AND FOR RAPIDLY CHARGING BATTERIES; U.S. Pat. No. 6,441,585, issued Aug. 17, 2002, entitled APPARATUS AND METHOD FOR TESTING RECHARGEABLE ENERGY STORAGE BATTERIES; U.S. Pat. No. 6,437,957, issued Aug. 20, 2002, entitled SYSTEM AND METHOD FOR PROVIDING SURGE, SHORT, AND REVERSE POLARITY CONNECTION PROTECTION; U.S. Pat. No. 6,445,158, issued Sep. 3, 2002, entitled VEHICLE ELECTRICAL SYSTEM TESTER WITH ENCODED OUTPUT; U.S. Pat. No. 6,456,045, issued Sep. 24, 2002, entitled INTEGRATED CONDUCTANCE AND LOAD TEST BASED ELECTRONIC BATTERY TESTER; U.S. Pat. No. 6,466,025, issued Oct. 15, 2002, entitled ALTERNATOR TESTER; U.S. Pat. No. 6,465,908, issued Oct. 15, 2002, entitled INTELLIGENT POWER MANAGEMENT SYSTEM; U.S. Pat. No. 6,466,026, issued Oct. 15, 2002, entitled PROGRAMMABLE CURRENT EXCITER FOR MEASURING AC IMMITTANCE OF CELLS AND BATTERIES; U.S. Pat. No. 6,469,511, issued Nov. 22, 2002, entitled BATTERY CLAMP WITH EMBEDDED ENVIRONMENT SENSOR; U.S. Pat. No. 6,497,209, issued Dec. 24, 2002, entitled SYSTEM AND METHOD FOR PROTECTING A CRANKING SUBSYSTEM; U.S. Pat. No. 6,507,196, issued Jan. 14, 2003; entitled BATTERY HAVING DISCHARGE STATE INDICATION; U.S. Pat. No. 6,534,993, issued Mar. 18, 2003, entitled ELECTRONIC BATTERY TESTER; U.S. Pat. No. 6,544,078, issued Apr. 8, 2003, entitled BATTERY CLAMP WITH INTEGRATED CURRENT SENSOR; U.S. Pat. No. 6,556,019, issued Apr. 29, 2003, entitled ELECTRONIC BATTERY TESTER; U.S. Pat. No. 6,566,883, issued May 20, 2003, entitled ELECTRONIC BATTERY TESTER; U.S. Pat. No. 6,586,941, issued Jul. 1, 2003, entitled BATTERY TESTER WITH DATABUS; U.S. Pat. No. 6,597,150, issued Jul. 22, 2003, entitled METHOD OF DISTRIBUTING JUMP-START BOOSTER PACKS; U.S. Pat. No. 6,621,272, issued Sep. 16, 2003, entitled PROGRAMMABLE CURRENT EXCITER FOR MEASURING AC IMMITTANCE OF CELLS AND BATTERIES; U.S. Pat. No. 6,623,314, issued Sep. 23, 2003, entitled KELVIN CLAMP FOR ELECTRICALLY COUPLING TO A BATTERY CONTACT; U.S. Pat. No. 6,633,165, issued Oct. 14, 2003, entitled IN-VEHICLE BATTERY MONITOR; U.S. Pat. No. 6,635,974, issued Oct. 21, 2003, entitled SELF-LEARNING POWER MANAGEMENT SYSTEM AND METHOD; U.S. Pat. No. 6,707,303, issued Mar. 16, 2004, entitled ELECTRONIC BATTERY TESTER; U.S. Pat. No. 6,737,831, issued May 18, 2004, entitled METHOD AND APPARATUS USING A CIRCUIT MODEL TO EVALUATE CELL/BATTERY PARAMETERS; U.S. Ser. No. 09/780,146, filed Feb. 9, 2001, entitled STORAGE BATTERY WITH INTEGRAL BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/880,473, filed Jun. 13, 2001; entitled BATTERY TEST MODULE; U.S. Pat. No. 6,495,990, issued Dec. 17, 2002, entitled METHOD AND APPARATUS FOR EVALUATING STORED CHARGE IN AN ELECTROCHEMICAL CELL OR BATTERY; U.S. Ser. No. 60/348,479, filed Oct. 29, 2001, entitled CONCEPT FOR TESTING HIGH POWER VRLA BATTERIES; U.S. Ser. No. 10/046,659, filed Oct. 29, 2001, entitled ENERGY MANAGEMENT SYSTEM FOR AUTOMOTIVE VEHICLE; U.S. Ser. No. 09/993,468, filed Nov. 14, 2001, entitled KELVIN CONNECTOR FOR A BATTERY POST; U.S. Ser. No. 10/042,451, filed Jan. 8, 2002, entitled BATTERY CHARGE CONTROL DEVICE; U.S. Ser. No. 10/093,853, filed Mar. 7, 2002, entitled ELECTRONIC BATTERY TESTER WITH NETWORK COMMUNICATION; U.S. Ser. No. 10/098,741, filed Mar. 14, 2002, entitled METHOD AND APPARATUS FOR AUDITING A BATTERY TEST; U.S. Ser. No. 10/112,114, filed Mar. 28, 2002, entitled BOOSTER PACK WITH STORAGE CAPACITOR; U.S. Ser. No. 10/109,734, filed Mar. 28, 2002, entitled APPARATUS AND METHOD FOR COUNTERACTING SELF DISCHARGE IN A STORAGE BATTERY; U.S. Ser. No. 10/112,105, filed Mar. 28, 2002, entitled CHARGE CONTROL SYSTEM FOR A VEHICLE BATTERY; U.S. Ser. No. 10/112,998, filed Mar. 29, 2002, entitled BATTERY TESTER WITH BATTERY REPLACEMENT OUTPUT; U.S. Ser. No. 10/119,297, filed Apr. 9, 2002, entitled METHOD AND APPARATUS FOR TESTING CELLS AND BATTERIES EMBEDDED IN SERIES/PARALLEL SYSTEMS; U.S. Ser. No. 60/387,046, filed Jun. 7, 2002, entitled METHOD AND APPARATUS FOR INCREASING THE LIFE OF A STORAGE BATTERY; U.S. Ser. No. 10/177,635, filed Jun. 21, 2002, entitled BATTERY CHARGER WITH BOOSTER PACK; U.S. Ser. No. 10/200,041, filed Jul. 19, 2002, entitled AUTOMOTIVE VEHICLE ELECTRICAL SYSTEM DIAGNOSTIC DEVICE; U.S. Ser. No. 10/217,913, filed Aug. 13, 2002, entitled, BATTERY TEST MODULE; U.S. Ser. No. 10/246, 439, filed Sep. 18, 2002, entitled BATTERY TESTER UPGRADE USING SOFTWARE KEY; U.S. Ser. No. 10/263,473, filed Oct. 2, 2002, entitled ELECTRONIC BATTERY TESTER WITH RELATIVE TEST OUTPUT; U.S. Ser. No. 10/271,342, filed Oct. 15, 2002, entitled IN-VEHICLE BATTERY MONITOR; U.S. Ser. No. 10/310,515, filed Dec. 5, 2002, entitled BATTERY TEST MODULE; U.S. Ser. No. 10/310,490, filed Dec. 5, 2002, entitled ELECTRONIC BATTERY TESTER; U.S. Ser. No. 10/310,385, filed Dec. 5, 2002, entitled BATTERY TEST MODULE; U.S. Ser. No. 60/437,224, filed Dec. 31, 2002, entitled DISCHARGE VOLTAGE PREDICTIONS; U.S. Ser. No. 10/349,053, filed Jan. 22, 2003, entitled APPARATUS AND METHOD FOR PROTECTING A BATTERY FROM OVERDISCHARGE; U.S. Ser. No. 10/388,855, filed Mar. 14, 2003, entitled ELECTRONIC BATTERY TESTER WITH BATTERY FAILURE TEMPERATURE DETERMINATION; U.S. Ser. No. 10/396,550, filed Mar. 25, 2003, entitled ELECTRONIC BATTERY TESTER; U.S. Ser. No. 60/467,872, filed May 5, 2003, entitled METHOD FOR DETERMINING BATTERY STATE OF CHARGE; U.S. Ser. No. 60/477,082, filed Jun. 9, 2003, entitled ALTERNATOR TESTER; U.S. Ser. No. 10/460,749, filed Jun. 12, 2003, entitled MODULAR BATTERY TESTER FOR SCAN TOOL; U.S. Ser. No. 10/462,323, filed Jun. 16, 2003, entitled ELECTRONIC BATTERY TESTER HAVING A USER INTERFACE TO CONFIGURE A PRINTER; U.S. Ser. No. 10/601,608, filed Jun. 23, 2003, entitled CABLE FOR ELECTRONIC BATTERY TESTER; U.S. Ser. No. 10/601,432, filed Jun. 23, 2003, entitled BATTERY TESTER CABLE WITH MEMORY; U.S. Ser. No. 60/490,153, filed Jul. 25, 2003, entitled SHUNT CONNECTION TO A PCB FOR AN ENERGY MANAGEMENT SYSTEM EMPLOYED IN AN AUTOMOTIVE VEHICLE; U.S. Ser. No. 10/653,342, filed Sep. 2, 2003, entitled ELECTRONIC BATTERY TESTER CONFIGURED TO PREDICT A LOAD TEST RESULT; U.S. Ser. No. 10/654,098, filed Sep. 3, 2003, entitled BATTERY TEST OUTPUTS ADJUSTED BASED UPON BATTERY TEMPERATURE AND THE STATE OF DISCHARGE OF THE BATTERY; U.S. Ser. No. 10/656,526, filed Sep. 5, 2003, entitled METHOD AND APPARATUS FOR MEASURING A PARAMETER OF A VEHICLE ELECTRICAL SYSTEM; U.S. Ser. No. 10/656,538, filed Sep. 5, 2003, entitled ALTERNATOR TESTER WITH ENCODED OUTPUT; U.S. Ser. No. 10/675,933, filed Sep. 30, 2003, entitled QUERY BASED ELECTRONIC BATTERY TESTER; U.S. Ser. No. 10/678,629, filed Oct. 3, 2003, entitled ELECTRONIC BATTERY TESTER/CHARGER WITH INTEGRATED BATTERY CELL TEMPERATURE MEASUREMENT DEVICE; U.S. Ser. No. 10/441,271, filed May 19, 2003, entitled ELECTRONIC BATTERY TESTER; U.S. Ser. No. 09/653,963, filed Sep. 1, 2000, entitled SYSTEM AND METHOD FOR CONTROLLING POWER GENERATION AND STORAGE; U.S. Ser. No. 09/654,217, filed Sep. 1, 2000, entitled SYSTEM AND METHOD FOR PROVIDING STEP-DOWN POWER CONVERSION USING INTELLIGENT SWITCH; U.S. Ser. No. 10/174,110, filed Jun. 18, 2002, entitled DAYTIME RUNNING LIGHT CONTROL USING AN INTELLIGENT POWER MANAGEMENT SYSTEM; U.S. Ser. No. 60/488,775, filed Jul. 21, 2003, entitled ULTRASONICALLY ASSISTED CHARGING; U.S. Ser. No. 10/258,441, filed Apr. 9, 2003, entitled CURRENT MEASURING CIRCUIT SUITED FOR BATTERIES; U.S. Ser. No. 10/705,020, filed Nov. 11, 2003, entitled APPARATUS AND METHOD FOR SIMULATING A BATTERY TESTER WITH A FIXED RESISTANCE LOAD; U.S. Ser. No. 10/280,186, filed Oct. 25, 2002, entitled BATTERY TESTER CONFIGURED TO RECEIVE A REMOVABLE DIGITAL MODULE; and U.S. Ser. No. 10/681,666, filed Oct. 8, 2003, entitled ELECTRONIC BATTERY TESTER WITH PROBE LIGHT; U.S. Ser. No. 10/748,792, filed Dec. 30, 2003, entitled APPARATUS AND METHOD FOR PREDICTING THE REMAINING DISCHARGE TIME OF A BATTERY; U.S. Ser. No. 10/767,945, filed Jan. 29, 2004, entitled ELECTRONIC BATTERY TESTER; U.S. Ser. No. 10/767,945, filed Jan. 29, 2004, entitled ELECTRONIC BATTERY TESTER; U.S. Ser. No. 10/783,682, filed Feb. 20, 2004, entitled REPLACEABLE CLAMP FOR ELECTRONIC BATTERY TESTER; U.S. Ser. No. 60/548,513, filed Feb. 27, 2004, entitled WIRELESS BATTERY MONITOR; U.S. Ser. No. 10/791,141, filed Mar. 2, 2004, entitled METHOD AND APPARATUS FOR AUDITING A BATTERY TEST; U.S. Ser. No. 60/557,366, filed Mar. 29, 2004, entitled BATTERY MONITORING SYSTEM WITHOUT CURRENT MEASUREMENT; U.S. Ser. No. 10/823,140, filed Apr. 13, 2004, entitled THEFT PREVENTION DEVICE FOR AUTOMOTIVE VEHICLE SERVICE CENTERS; which are incorporated herein in their entirety.

With the advent of accurate battery testing, it has become apparent that in some instances the battery in the vehicle may be good, and a problem related to the battery charging system is the cause of the perceived battery failure. A vehicle charging system generally includes the battery, an alternator, a regulator and an alternator drive belt. In most modern vehicles, the regulator is built into the alternator housing and is referred to as an internal regulator. The role of the charging system is two fold. First, the alternator provides charging current for the battery. This charging current ensures that the battery remains charged while the vehicle is being driven and therefore will have sufficient capacity to subsequently start the engine. Second, the alternator provides an output current for all of the vehicle electrical loads. In general, the alternator output, the battery capacity, the starter draw and the vehicle electrical load requirements are matched to each other for optimal performance. In a properly functioning charging system, the alternator will be capable of outputting enough current to drive the vehicle electrical loads while simultaneously charging the battery. Typically, alternators range in size from 60 to 120 amps.

A number of charging system testers have been used to evaluate the performance of the vehicle charging system. These testers generally use an inductive "amp clamp." The amp clamp is placed around a cable or wire and inductively couples to the cable or wire such that the current passing through the wire can be measured. This measurement can be made without having to disconnect the wire. In such a system, typically the operator determines the rated size of the alternator. Next, the operator connects the amp clamp to the output cable of the alternator and an electrical load such as a carbon pile load tester, is placed across the battery. This is a large resistive load capable of receiving several hundred amps which will force the alternator to provide its maximum output. The maximum output current can then be measured using the amp clamp connection. If the measured output is less than the rated output, the alternator is determined to be malfunctioning. Such a test is cumbersome as the equipment is large and difficult to handle. Further, it is difficult, particularly with compact engines, to reach the alternator output cable. Further, in some cases, the amp clamp may not fit around the output cable. It is also very easy to place the amp clamp around the wrong cable causing a false test.

Another testing technique is described in U.S. Pat. No. 4,207,611, which issued Jun. 10, 1980 and is entitled APPA- RATUS AND METHOD FOR CALIBRATED TESTING OF A VEHICLE ELECTRICAL SYSTEM. The device described in this reference monitors voltage changes present at the cigarette lighter of an automotive vehicle in order to determine the condition of the alternator by applying internal loads such as head lamps and blowers, while the engine is running.

SUMMARY OF THE INVENTION

An alternator tester is provided for testing an alternator of a vehicle while the alternator is coupled to the vehicle. A sensor is configured to couple to the vehicle and sense a signal related to operation of the alternator. A memory contains data related to operator instructions for performing an alternator tester of a function of vehicle type. A processor configured to provide an output indication of alternator condition based upon the sensed signal. An extra load or connection can be provided for coupling to the electrical system.

DETAILED DESCRIPTION OF THE PREFERRED EMBODIMENTS

Figure 1:
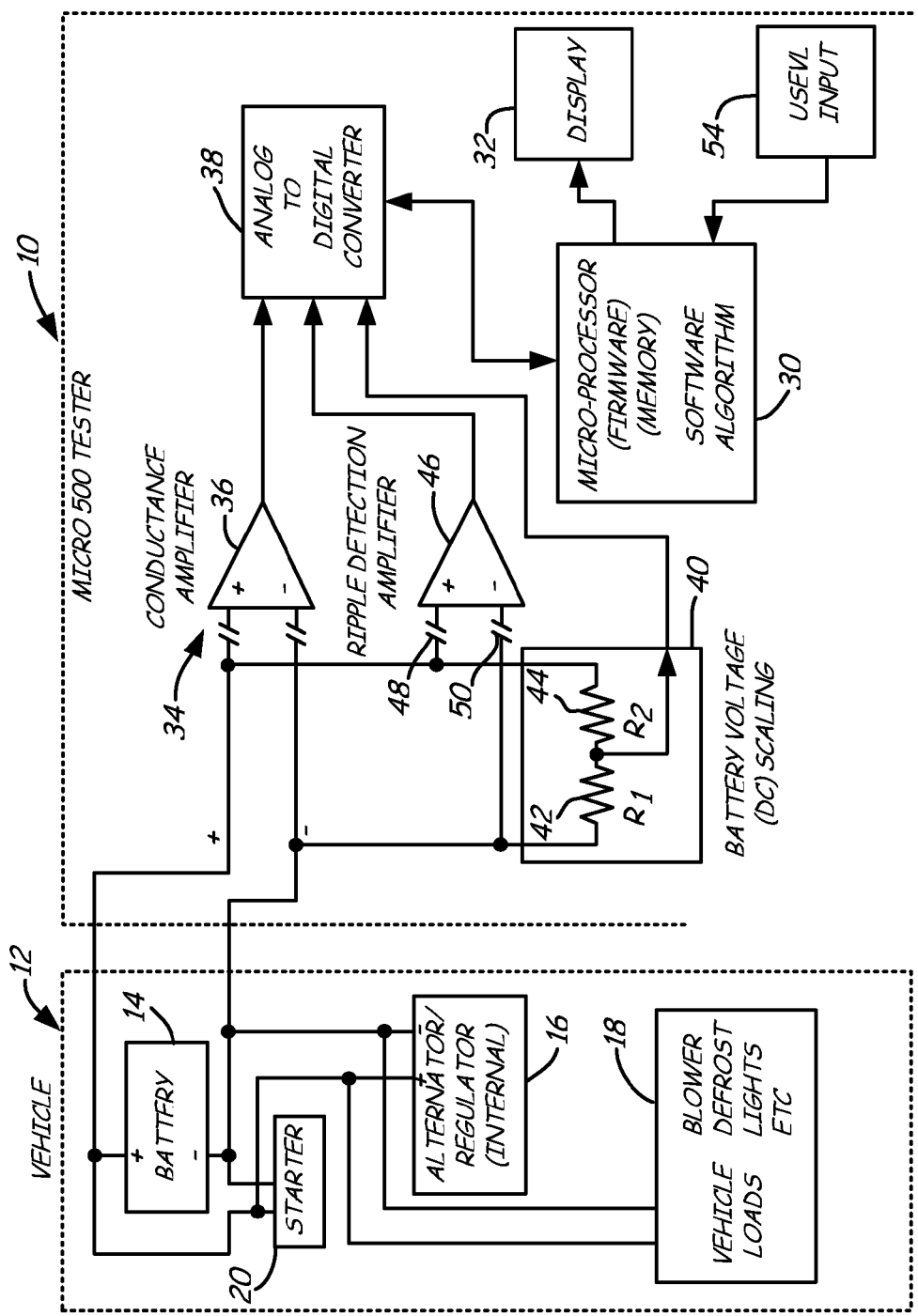
FIG. 1 is a simplified block diagram of an automotive battery charging system tester in accordance with the present invention.

FIG. 1 is a simplified block diagram of a battery charging system tester 10 in accordance with one embodiment of the present invention coupled to a vehicle 12. Vehicle 12 includes a battery 14 having positive and negative terminals, an alternator with internal regulator 16, various vehicle loads 18, and a starter motor 20. In operation, battery 14 provides power to starter 20 and vehicle loads 18 when the engine in vehicle 12 is not running. When the engine in vehicle 12 is running, alternator 16 is used to power vehicle loads 18 and provide a charging current to battery 14 to maintain the charge of battery 14.

Charging system tester 10 includes a microprocessor 30 which controls operation of tester 10 and provides instructions and test result information to an operator through, for example, a display 32. Tester 10 includes a battery testing section 34 which is illustrated generally as conductance amplifier 36. Section 34 operates in accordance with, for example, the conductance based battery testing techniques described in Champlin patents U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME-VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER DEVICE; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE; U.S. Pat. No. 5,585,416, issued Dec. 10, 1996, entitled APPARATUS AND METHOD FOR STEP-CHARGING BATTERIES TO OPTIMIZE CHARGE ACCEPTANCE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,589,757, issued Dec. 31, 1996, entitled APPARATUS AND METHOD FOR STEP-CHARGING BATTERIES TO OPTIMIZE CHARGE ACCEPTANCE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,656,920, issued Aug. 12, 1997, entitled METHOD FOR OPTIMIZING THE CHARGING LEAD-ACID BATTERIES AND AN INTERACTIVE CHARGER; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF CHARGE; U.S. Pat. No. 5,831,435, issued Nov. 3, 1998, entitled BATTERY TESTER FOR JIS STANDARD; U.S. Pat. No. 5,871,858, issued Feb. 16, 1999, entitled ANTI-THEFT BATTERY; U.S. Pat. No. 5,914,605, issued Jun. 22, 1999, entitled ELECTRONIC BATTERY TESTER; U.S. Pat. No. 5,945,829, issued Aug. 31, 1999, entitled MIDPOINT BATTERY MONITORING; U.S. Pat. No. 6,002,238, issued Dec. 14, 1999, entitled METHOD AND APPARATUS FOR MEASURING COMPLEX IMPEDANCE OF CELLS AND BATTERIES; U.S. Pat. No. 6,037,751, issued Mar. 14, 2000, entitled APPARATUS FOR CHARGING BATTERIES; U.S. Pat. No. 6,037,777, issued Mar. 14, 2000, entitled METHOD AND APPARATUS FOR DETERMINING BATTERY PROPERTIES FROM COMPLEX IMPEDANCE/ADMITTANCE; U.S. Pat. No. 6,051,976, issued Apr. 18, 2000, entitled METHOD AND APPARATUS FOR AUDITING A BATTERY TEST; U.S. Pat. No. 6,081,098, issued Jun. 27, 2000, entitled METHOD AND APPARATUS FOR CHARGING A BATTERY; U.S. Pat. No. 6,091,245, issued Jul. 18, 2000, entitled METHOD AND APPARATUS FOR AUDITING A BATTERY TEST; U.S. Pat. No. 6,104,167, issued Aug. 15, 2000, entitled METHOD AND APPARATUS FOR CHARGING A BATTERY; U.S. Pat. No. 6,137,269, issued Oct. 24, 2000, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,163,156, issued Dec. 19, 2000, entitled ELECTRICAL CONNECTION FOR ELECTRONIC BATTERY TESTER; U.S. Pat. No. 6,172,483, issued Jan. 9, 2001, entitled METHOD AND APPARATUS FOR MEASURING COMPLEX IMPEDANCE OF CELLS AND BATTERIES; U.S. Pat. No. 6,172,505, issued Jan. 9, 2001, entitled ELECTRONIC BATTERY TESTER; U.S. Pat. No. 6,222,369, issued Apr. 24, 2001, entitled METHOD AND APPARATUS FOR DETERMINING BATTERY PROPERTIES FROM COMPLEX IMPEDANCE/ADMITTANCE; U.S. Pat. No. 6,225,808, issued May 1, 2001, entitled TEST COUNTER FOR ELECTRONIC BATTERY TESTER; U.S. Pat. No. 6,249,124, issued Jun. 19, 2001, entitled ELECTRONIC BATTERY TESTER WITH INTERNAL BATTERY; U.S. Pat. No. 6,259,254, issued Jul. 10, 2001, entitled APPARATUS AND METHOD FOR CARRYING OUT DIAGNOSTIC TESTS ON BATTERIES AND FOR RAPIDLY CHARGING BATTERIES; U.S. Pat. No. 6,262,563, issued Jul. 17, 2001, entitled METHOD AND APPARATUS FOR MEASURING COMPLEX ADMITTANCE OF CELLS AND BATTERIES; U.S. Pat. No. 6,294,896, issued Sep. 25, 2001; entitled METHOD AND APPARATUS FOR MEASURING COMPLEX SELF-IMMITANCE OF A GENERAL ELECTRICAL ELEMENT; U.S. Pat. No. 6,294,897, issued Sep. 25, 2001, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,304,087, issued Oct. 16, 2001, entitled APPARATUS FOR CALIBRATING ELECTRONIC BATTERY TESTER; U.S. Pat. No. 6,310,481, issued Oct. 30, 2001, entitled ELECTRONIC BATTERY TESTER; U.S. Pat. No. 6,313,607, issued Nov. 6, 2001, entitled METHOD AND APPARATUS FOR EVALUATING STORED CHARGE IN AN ELECTROCHEMICAL CELL OR BATTERY; U.S. Pat. No. 6,313,608, issued Nov. 6, 2001, entitled METHOD AND APPARATUS FOR CHARGING A BATTERY; U.S. Pat. No. 6,316,914, issued Nov. 13, 2001, entitled TESTING PARALLEL STRINGS OF STORAGE BATTERIES; U.S. Pat. No. 6,323,650, issued Nov. 27, 2001, entitled ELECTRONIC BATTERY TESTER; U.S. Pat. No. 6,329,793, issued Dec. 11, 2001, entitled METHOD AND APPARATUS FOR CHARGING A BATTERY; U.S. Pat. No. 6,331,762, issued Dec. 18, 2001, entitled ENERGY MANAGEMENT SYSTEM FOR AUTOMOTIVE VEHICLE; U.S. Pat. No. 6,332,113, issued Dec. 18, 2001, entitled ELECTRONIC BATTERY TESTER; U.S. Pat. No. 6,351,102, issued Feb. 26, 2002, entitled AUTOMOTIVE BATTERY CHARGING SYSTEM TESTER; U.S. Pat. No. 6,359,441, issued Mar. 19, 2002, entitled ELECTRONIC BATTERY TESTER; U.S. Pat. No. 6,363,303, issued Mar. 26, 2002, entitled ALTERNATOR DIAGNOSTIC SYSTEM; U.S. Pat. No. 6,377,031, issued Apr. 23, 2002, entitled INTELLIGENT SWITCH FOR POWER MANAGEMENT; U.S. Pat. No. 6,392,414, issued May 21, 2002, entitled ELECTRONIC BATTERY TESTER; U.S. Pat. No. 6,417,669, issued Jul. 9, 2002, entitled SUPPRESSING INTERFERENCE IN AC MEASUREMENTS OF CELLS, BATTERIES AND OTHER ELECTRICAL ELEMENTS; U.S. Pat. No. 6,424,158, issued Jul. 23, 2002, entitled APPARATUS AND METHOD FOR CARRYING OUT DIAGNOSTIC TESTS ON BATTERIES AND FOR RAPIDLY CHARGING BATTERIES; U.S. Pat. No. 6,441,585, issued Aug. 17, 2002, entitled APPARATUS AND METHOD FOR TESTING RECHARGEABLE ENERGY STORAGE BATTERIES; U.S. Pat. No. 6,437,957, issued Aug. 20, 2002, entitled SYSTEM AND METHOD FOR PROVIDING SURGE, SHORT, AND REVERSE POLARITY CONNECTION PROTECTION; U.S. Pat. No. 6,445,158, issued Sep. 3, 2002, entitled VEHICLE ELECTRICAL SYSTEM TESTER WITH ENCODED OUTPUT; U.S. Pat. No. 6,456,045, issued Sep. 24, 2002, entitled INTEGRATED CONDUCTANCE AND LOAD TEST BASED ELECTRONIC BATTERY TESTER; U.S. Pat. No. 6,466,025, issued Oct. 15, 2002, entitled ALTERNATOR TESTER; U.S. Pat. No. 6,465,908, issued Oct. 15, 2002, entitled INTELLIGENT POWER MANAGEMENT SYSTEM; U.S. Pat. No. 6,466,026, issued Oct. 15, 2002, entitled PROGRAMMABLE CURRENT EXCITER FOR MEASURING AC IMMITTANCE OF CELLS AND BATTERIES; U.S. Pat. No. 6,469,511, issued Nov. 22, 2002, entitled BATTERY CLAMP WITH EMBEDDED ENVIRONMENT SENSOR; U.S. Pat. No. 6,497,209, issued Dec. 24, 2002, entitled SYSTEM AND METHOD FOR PROTECTING A CRANKING SUBSYSTEM; U.S. Pat. No. 6,507,196, issued Jan. 14, 2003; entitled BATTERY HAVING DISCHARGE STATE INDICATION; U.S. Pat. No. 6,534,993, issued Mar. 18, 2003, entitled ELECTRONIC BATTERY TESTER; U.S. Pat. No. 6,544,078, issued Apr. 8, 2003, entitled BATTERY CLAMP WITH INTEGRATED CURRENT SENSOR; U.S. Pat. No. 6,556,019, issued Apr. 29, 2003, entitled ELECTRONIC BATTERY TESTER; U.S. Pat. No. 6,566,883, issued May 20, 2003, entitled ELECTRONIC BATTERY TESTER; U.S. Pat. No. 6,586,941, issued Jul. 1, 2003, entitled BATTERY TESTER WITH DATABUS; U.S. Pat. No. 6,597,150, issued Jul. 22, 2003, entitled METHOD OF DISTRIBUTING JUMP-START BOOSTER PACKS; U.S. Pat. No. 6,621,272, issued Sep. 16, 2003, entitled PROGRAMMABLE CURRENT EXCITER FOR MEASURING AC IMMITTANCE OF CELLS AND BATTERIES; U.S. Pat. No. 6,623,314, issued Sep. 23, 2003, entitled KELVIN CLAMP FOR ELECTRICALLY COUPLING TO A BATTERY CONTACT; U.S. Pat. No. 6,633,165, issued Oct. 14, 2003, entitled IN-VEHICLE BATTERY MONITOR; U.S. Pat. No. 6,635,974, issued Oct. 21, 2003, entitled SELF-LEARNING POWER MANAGEMENT SYSTEM AND METHOD; U.S. Pat. No. 6,707,303, issued Mar. 16, 2004, entitled ELECTRONIC BATTERY TESTER; U.S. Pat. No. 6,737,831, issued May 18, 2004, entitled METHOD AND APPARATUS USING A CIRCUIT MODEL TO EVALUATE CELL/BATTERY PARAMETERS. Section 34 is illustrated in very simplified form and conductance amplifier 36 provides an output to an analog to digital converter 38 which is related to the internal conductance of battery 14.

A DC voltage sensor 40 includes voltage scaling resistors 42 and 44 and is coupled to battery 14 to provide an output to analog to digital converter 38 which is representative of the DC voltage across battery 14. Further, an AC ripple detector amplifier 46 is coupled to battery 14 through capacitors 48 and 50 and provides an output to analog to digital converter 38 which is representative of the AC ripple voltage across battery 14.

Microprocessor 30 controls analog to digital converter 38 to select which of the three inputs to digitize. Microprocessor 30 includes firmware, memory, and a software program in accordance with the invention. The user input 54 is coupled to microprocessor 30 to provide the information to microprocessor 30 from an operator.

Preferably, tester 10 is portable such that it may be easily moved between vehicles or otherwise transported. Portability of tester 10 is achieved because tester 10 does not require large internal carbon pile loads to load the battery charging system. Instead, as described herein, tester 10 utilizes loads internal to the vehicle 12 in testing the charging system. Further, the battery tester performed by tester 10 is in accordance with the non-load battery testing technique as described above.

Figure 2:
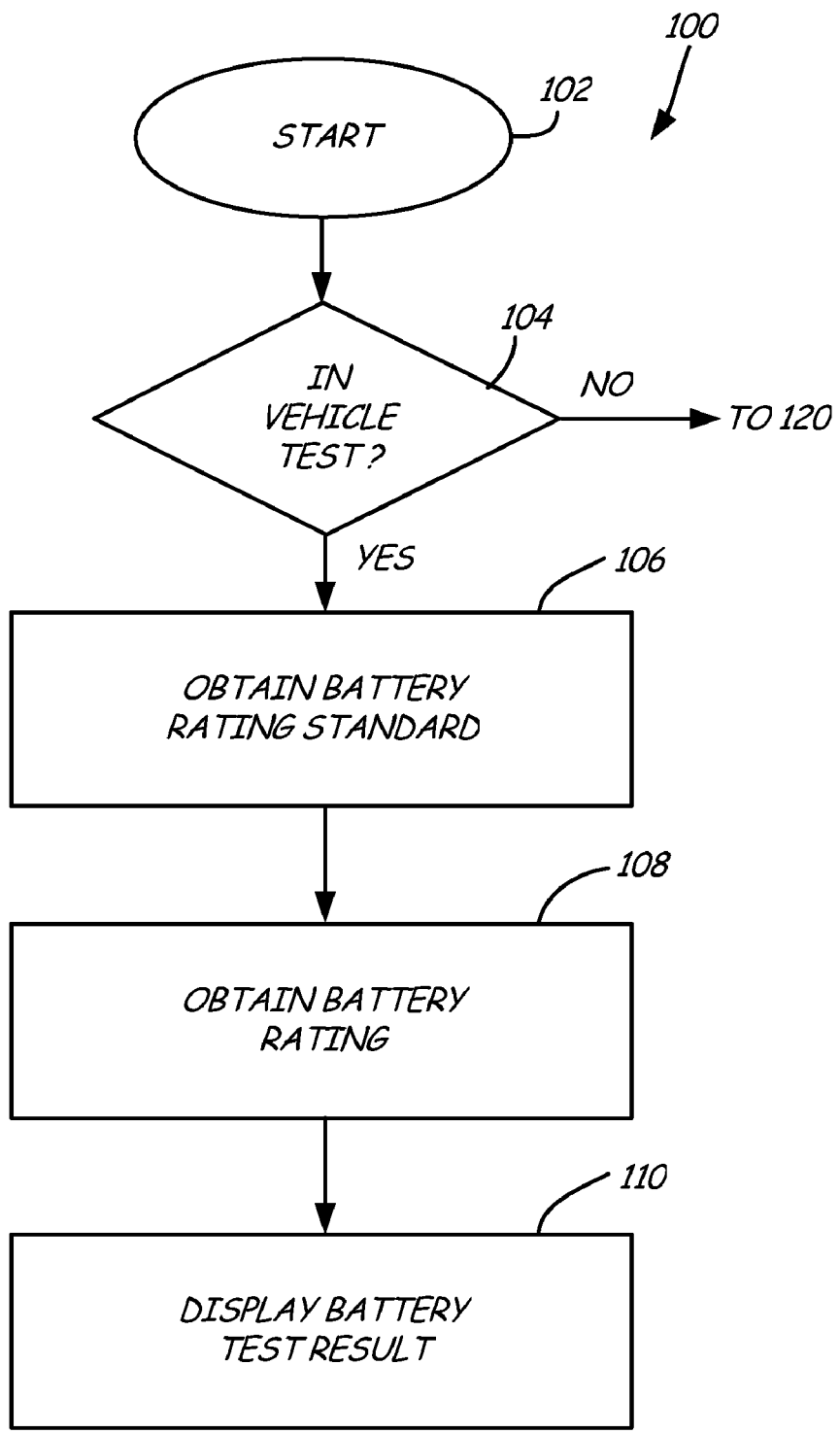
FIG. 2 is a simplified flow chart showing steps in a battery test.

FIGS. 2-8 are simplified block diagrams illustrating steps in accordance with the invention. User input for the steps can be through user input device 54 and a display can be provided through display device 32. In FIG. 2, block diagram 100 begins at start block 102. At block 104 the type of vehicle test is selected. If it is an in-vehicle test, control is passed to block 106. If it is an out of vehicle test, control is passed to block 120. At block 106, the user is prompted to input the battery rating standard to be used for the test. Various standards include SAE, DIN, IEC, EN, JIS or a battery stock number. At block 108, the user is prompted to input the battery rating according to the selected standard. A battery test is then performed at block 110, the results of the battery test are displayed including battery voltage, battery cold cranking amps, and a general condition of the battery such as good, good but recharged, charged and retest, replace battery or bad cell-replace. Any type of battery test may be used, however, conductance, resistance, impedance or admittance based testing as described in the Champlin and Midtronics patents is preferred.

Figure 3:
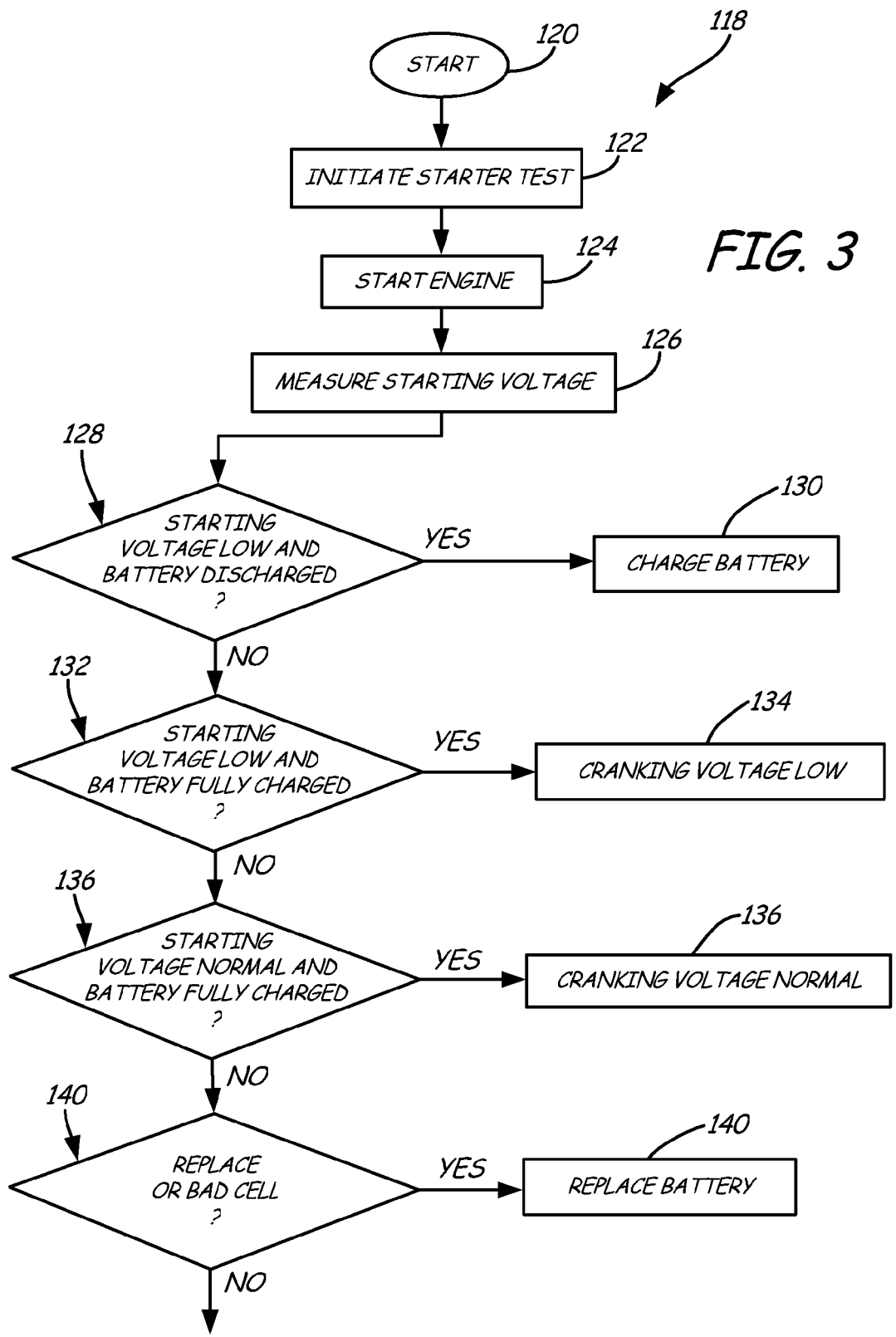
FIG. 3 is a simplified flow chart showing steps in a starter test.

FIG. 3 is a simplified block diagram 118 for an in-vehicle test. When the user initiates a starter test, for example through an input through user input 54, control is passed to block 124 and the operator is instructed to start the engine. Microprocessor 30 detects that the engine is being started by monitoring the resultant in drop in voltage across battery 14. The starting voltage is measured at block 126. Once the engine starts, and the voltage begins to rise, the tester 10 will display one of four different test results. At block 128, if the starting voltage is low and the battery is discharged, the message "charge battery" is displayed at block 130. At block 132, if the starting voltage is low and the battery has a full charge, the message "cranking voltage low" is displayed at block 134 along with the measured voltage. If at block 136, the starting voltage is normal and the battery has a full charge, block 138 displays cranking voltage normal along with the measured voltage. If, at block 140, the battery test result was either replaced or bad cell, block 142 displays the message replace battery. The low and normal cranking voltages can be selected as desired and using known techniques.

Figure 4:
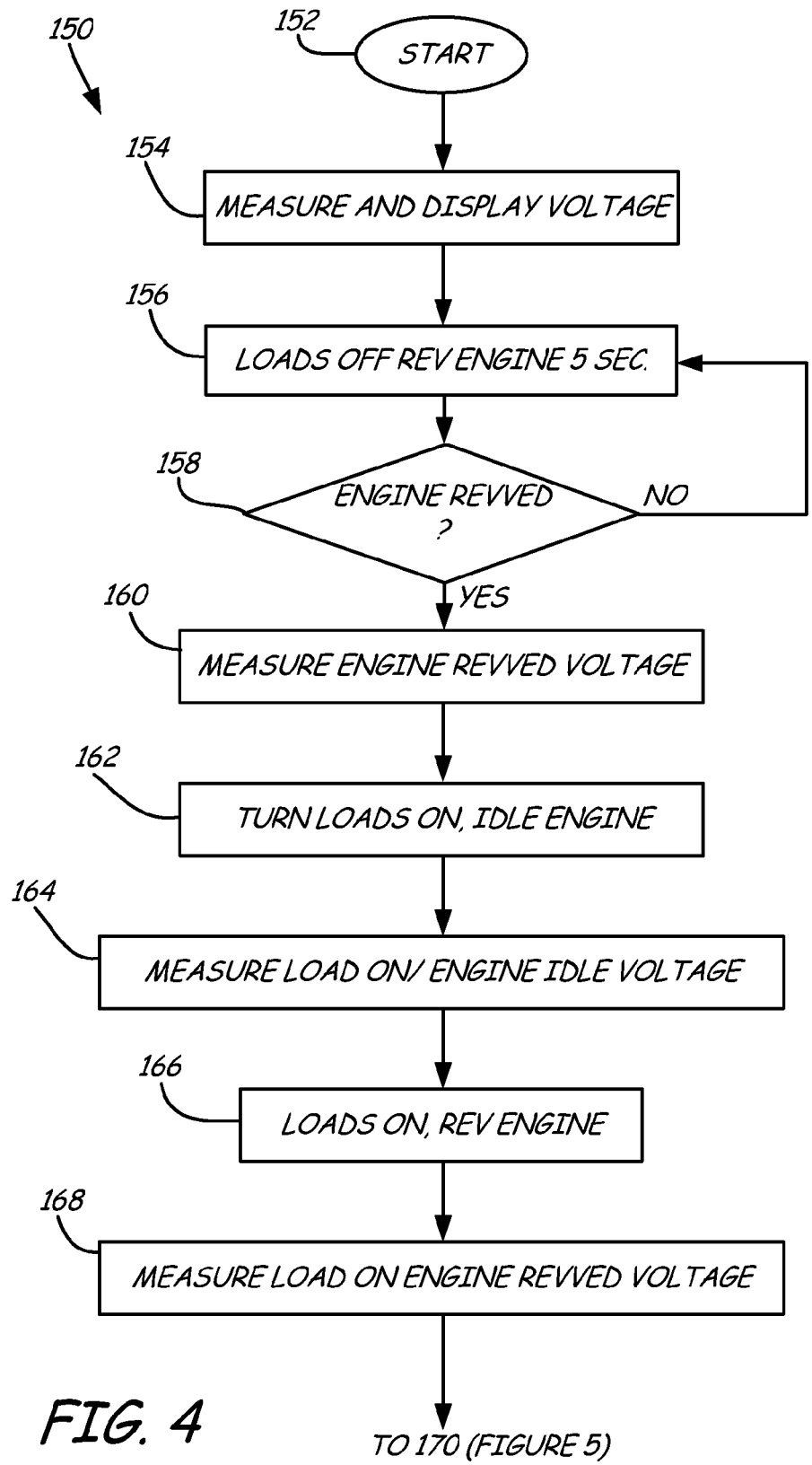
FIG. 4 is a simplified flow chart showing steps in a charging system test.
Figure 5:
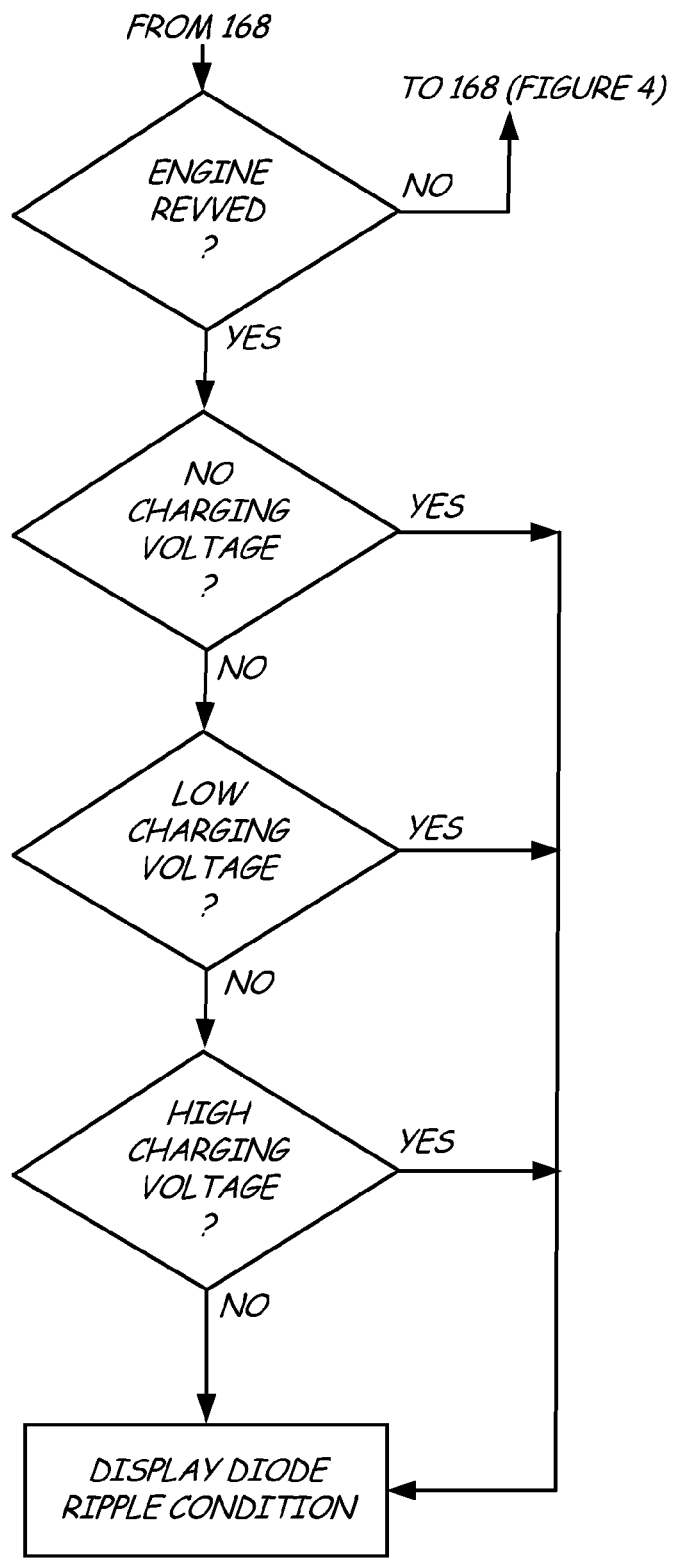
FIG. 5 is a simplified flow chart showing further steps in the charging system test of FIG. 4.

FIG. 4 is a block diagram 150 which illustrates steps in a charging system test in accordance with another aspect of the invention. At block 152, the procedure is initiated by the operator while the engine in vehicle 12 is running. At block 154, the voltage across battery 14 due to alternator 16 is measured and displayed. The operator may press and enter button on user input 54 to continue operation and at block 156 the operator is instructed to turn off all vehicle loads and rev the engine for 5 seconds. At block 158, the revving of the engine is detected by monitoring the AC ripple across battery 14 using ripple detection amplifier 46. If, after 30 seconds, microprocessor 30 does not detect engine revving, control is returned to block 156 and the procedure is repeated. At block 160, the engine revved voltage is measured and control is passed to block 162 where the operator is instructed to turn loads within the vehicle (i.e., headlights, fans, etc.) on and idle the engine. Again, an enter key on user input 54 is pressed and control is passed to block 164 and tester 10 measures the load on, engine idle voltage. At 166, the user is instructed to rev the engine with the loads on and another voltage is obtained at block 168. Control is then passed to block 170 in FIG. 5 and it is determined whether the engine speed has increased. At block 172, if there is no charging voltage, that is i.e., the charging voltage is less than or the same as the idle voltage, an output is displayed. Similarly, if the charging voltage is low such that the total voltage across the battery is less than, for example, 13 volts, an output is displayed. At block 176, if a high charging voltage is detected, such as more than 2.5 volts above the idle voltage, an output is displayed. When control reaches block 178, an output is provided indicative of the diode ripple voltage. This voltage can be obtained during any of the measurements where the engine is revved. If the ripple voltage is greater than, for example, 130 mV, an indication is provided that there is a diode or a stator problem.

Figure 6:
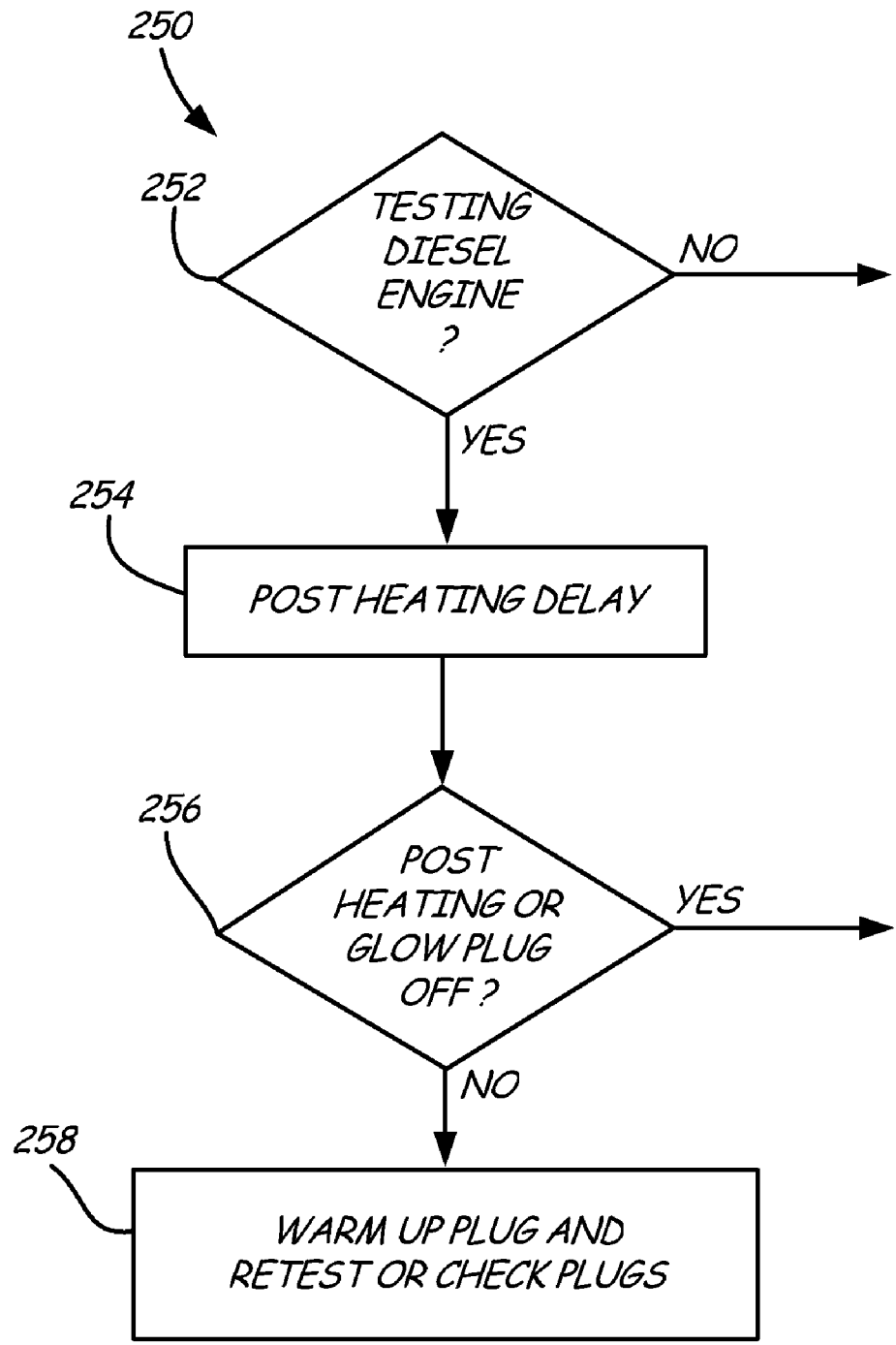
FIG. 6 is a simplified flow chart showing steps in a diesel engine charging system test.
Figure 7:
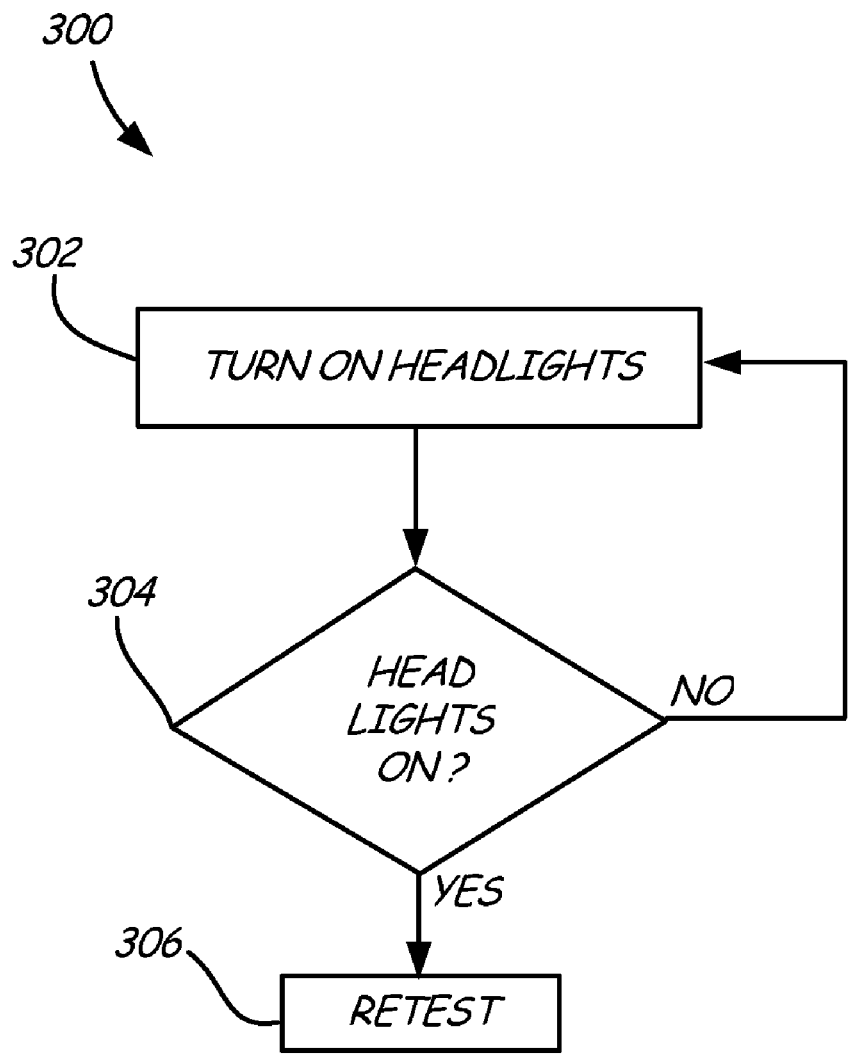
FIG. 7 is a simplified flow chart showing steps to remove surface charge.

FIG. 6 is a block diagram of a diesel test algorithm 250. If the tester 10 does not detect a charging or a ripple voltage, the tester begins the diesel test algorithm shown at 250. This allows the glow plugs of a diesel engine to turn off. If, at any time during the procedure, a charging voltage and a ripple are detected, the normal test procedure will resume. At block 252, the user is asked to input information as to whether the engine under test is a diesel engine. If the engine is not a diesel engine, a charging system problem is indicated. If the engine is diesel, control is passed to block 254 and a post heating delay, such as 40 seconds, passes at block 256, if there is a post heating or glow plugs off condition, then a charging system problem is indicated. If there is a post heating or glow plug on condition, the operator is instructed to warm up the plugs and retest, or check the glow plugs.

Additionally, the tester 10 can receive a temperature input from the operator and adjust the battery test appropriately.

If the battery test indicates that the battery may have been charged before testing, the user is prompted to indicate whether the test is being performed before charging the battery or after charging the battery and the system is retested.

Figure 8:
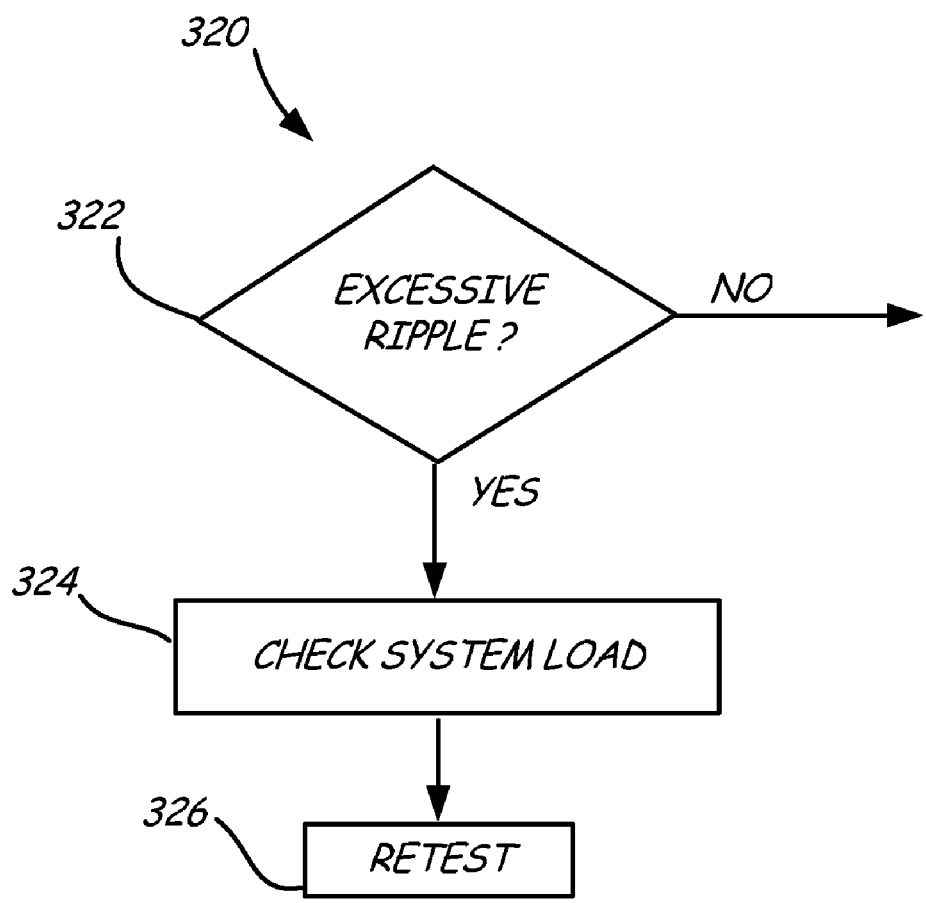
FIG. 8 is a simplified flow chart showing a ripple test.

If the tester 10 determines that the battery may have surface charge, the operator is instructed to turn on the vehicle head lights as indicated in flow chart 300 at block 302. If a drop in voltage is detected at block 304 indicating that the head lights have been turned on, control is passed to block 306. If, however, the head lights have not been turned on, control is returned to block 302. At block 306, the system is retested. Flow chart 320 of FIG. 8 shows a noise detection algorithm. If excessive ripple is detected during engine idle periods at block 322, the operator is instructed to check system loads at block 324. At block 326, the system is retested.

Based upon the test, an output can be printed or otherwise provided to an operator indicating the results of the battery test, the battery rating, the actual measured battery capacity, the voltage, the voltage during cranking and whether the cranking voltage is normal, the condition of the charging system along with the idle voltage and the load voltage and the presence of excessive diode ripple.

In general, the present invention provides the integration of an alternator test with a battery test, an alternator test with a starter test, a starter test with an battery test, or an alternator test with a battery test and with a starter test. The invention allows information from any of these tests to be shared with the other test(s).

In one aspect, tester 10 measures the voltage across battery 20. Both the AC and DC voltages are recorded. The AC voltage is used to identify alternator diode and stator faults. The DC voltage measurement is used to determine if the charging system is functioning properly. The electrical loads of the vehicle are used to load the alternator for convenience. However, other types of loads can also be applied. The tester continually monitors the charging voltage across the battery. The operator is instructed to turn on vehicle loads and rev the engine. The charging voltage is recorded with the engine revved. In a properly functioning charging system, this charging voltage should be greater than the measured battery voltage with the engine off. This indicates that current is flowing into the battery and thus the battery is being charged even with loads applied to the charging system. This testing principle does not require knowledge of the alternator size, or even the amount of current that the alternator is producing. In the testing, various DC voltages across the battery are measured including battery voltage with the engine off (stead state voltage), battery voltage with the engine running at idle (idle voltage), battery voltage with the engine revved, for example between 1,000 RPM and 2,500 RPM, and the vehicle loads off and battery voltage with the engine revved and vehicle loads on. The AC voltage across the battery which is measured with the engine running is used to detect excessive ripple which may be caused by a faulty diode or stator. Ripple of over about 130 mV is indicative of a diode or stator problem. Additionally, the ripple can be used by tester 10 to detect changes in engine RPM.

An initial revving of the engine can be used prior to returning to idle to ensure that the alternator field circuit is excited and conducting current. If the idle voltage with the loads off is less than or equal to the steady state voltage, then a charging problem exists. If the charging voltage exceeds the steady state voltage by more than, for example, 0.5 volts, then a regulator problem is indicated.

With the engine revved and the vehicle loads (such as head lights, blower, rear defrost, etc.) turned on, the revved and loaded voltage across the battery is recorded and compared to the steady state battery voltage. If the charging voltage with loads turned on while the engine is revved is not greater than the steady state voltage, then current is not flowing into the battery and the battery is not being charge. This indicates a problem and that the alternator cannot meet the needs of the vehicle while still charging the battery.

With the present invention, the battery test can be used to prevent incorrectly identifying the charging system as being faulty. Thus, the battery test ensures that a good battery is being charged during the charging system test. The measurement of the cranking voltage while the engine is being started is used to determine whether there is a starter problem. In diesel engine applications, the charging system voltage is measured to determine if the engine glow plug operation is effecting the charging system test result. A long cabling (i.e., 10 to 15 feet) can be used such that the tester 10 can be operated while sitting in the vehicle. The battery testing is preferably performed by measuring the conductance, impedance, resistance or admittance of the battery.

Further, the battery test with the engine off can be compared with the battery test with the engine on and used to diagnosis the system.

Another aspect of the present invention relates to the generation of an "audit code" based upon the results of a test. As used herein, the term audit code refers to an encrypted code which contains information about a test performed on an electrical system of a vehicle. Such information can be particularly useful in monitoring the operation and usage of test equipment. For example, if the present invention is used to test automobiles and warranty claims are then submitted to a manufacturer based upon the results of a test, the present invention can output an audit code after the completion of the test. A manufacturer can decrypt the audit code and reject a warranty claim if the audit code indicates the claim has been falsified. The audit code can contain information, in an encrypted format, which relates to the tests which were performed on a particular vehicle. For example, a manufacturer, such as a vehicle manufacturer, can audit the test(s) performed on a vehicle to reduce the occurrence of warranty fraud. Warranty fraud can occur when an unscrupulous operator attempts to falsify test results in order to return a properly functioning component or to receive payment for services which were not actually performed on a vehicle. Warranty fraud can cost a manufacturer a great deal of money and also lead to misdirected research and development efforts in an attempt to correct defects which do not actually exist. In such an embodiment, any of the tests performed by the present invention or measurements obtained by the invention can be included in the audit code. More generally, the audit code of the present invention can be formed using the results of any starter motor test, alternator test, battery test or a AC ripple test. In a general embodiment of this aspect of the present invention, the particular testing technique used to obtain the test results may be any appropriate technique and is not limited to be specific techniques set forth herein.

Figure 9:
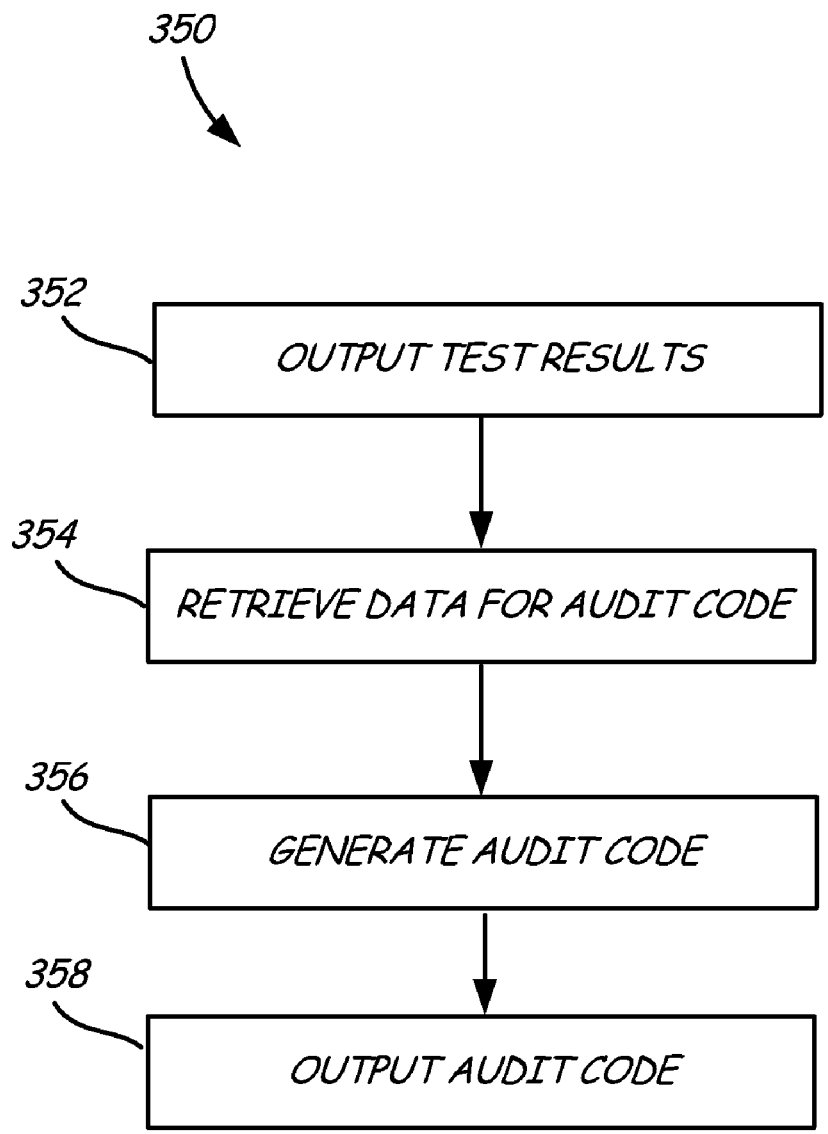
FIG. 9 is a simplified block diagram showing generation of an audit code in accordance with one aspect of the invention.

FIG. 9 is a simplified block diagram 350 showing steps in accordance with generation of an audit code of the present invention. The steps set forth in block diagram 350 are typically carried out by, for example, a microprocessor such as microprocessor 30 shown in FIG. 1. However, the steps may be implemented in hardware, software or their combination as appropriate.

Block 352 illustrates the general step of outputting test results. The test results can be, for example, the results of a starter test, alternator test, battery test or diode ripple test. At block 354, the microprocessor 30 retrieves the data which will be used in the audit code. As discussed herein, such data can comprise many different types of data including rating, operator or user identification, test data or results, etc. For example, this data can be retrieved from memory associated with the microprocessor. At block 356, microprocessor 30 generates an audit code based upon the retrieved data in accordance with any of the embodiments set forth herein. The audit code is generated using an encryption algorithm. The particular algorithm used can be selected in accordance with the desired level of security. However, for most systems, a transposition offset cipher can be used in which individual data elements are transposed and offset by known amounts. More complex algorithms such as RSA, rotating codes or public key based encryption algorithms can be used if desired. At block 358, the microprocessor 30 outputs the audit code, for example, on display 32. An operator can then copy the audit code onto a return form, or enter the audit code into a database system of the manufacturer. If the audit code will be handled directly by an operator, the code and encryption algorithm should be such that the output is alphanumeric or in a form which is otherwise easy to copy onto a warranty submission form. Of course, if the code is electronically submitted, for example through a data link, the code can take any form. Such data links include, for example, modem or hard wired links, infrared links, ultrasonic links, bar code outputs, RF outputs, or other techniques for conveying data which are known in the art.

The particular data which is used to form the audit code can be any of the final test results or intermediary measurements (that is, measurements which are used to obtain a final test result) set forth herein. For example, the measured starter voltage during cranking, the starter test result, the measured alternator voltage or voltages, the alternator test result, or the ripple test result can be encoded. Battery condition, state of charge or time to charge information can be encoded. Further, the date of the test can be maintained by microprocessor 30 and can be included in the audit code. Using this information, the test can be audited to determine if the measured alternator voltage or starter voltage could actually result in the encoded test results. Further, by checking the encoded date, it is possible to determine whether the vehicle was even in a repair shop during the test period. The raw data, such as voltage levels or other intermediary measurements, can be used by a manufacturer to collect data regarding the operation of a product. For example, a manufacturer could note that a particular change to an alternator resulted in a statistically significant drop in alternator voltages as measured in actual vehicles. This could be used in a research and development effort to improve system operation.

Other information which can be encoded into the audit code includes information regarding the make or model of the vehicle or battery, information such as the VIN identifying the vehicle, temperature information, time of day information, an identification which specifies the operator, the identity of the dealer or shop performing the test, data which identifies the test equipment or the software used in the test equipment, system or component ratings or other information entered by an operator, the number or sequence of the test, or other information.

In the past, when an alternator of a vehicle was suspected of being defective, the alternator could be tested by removing the alternator from the vehicle and performing what was referred to as a "bench test" on the alternator. In a bench test, the alternator is connected to a motor which is used to turn the alternator. The output from the alternator can then be observed. Further, more complex bench testing techniques include various test leads which can be coupled to the alternator for more complex testing. For example, some alternators include an electrical plug that is used by the vehicle computer system, or is employed purely for testing, which provides access and control of various functions of the alternator. The present invention includes a portable alternator tester which allows an operator to perform complex tests on an alternator of a vehicle without removing the alternator from the vehicle. The testing circuitry is preferably implemented in a hand-held configuration. For example, if the tests discussed above indicate that the alternator of the vehicle has failed, additional tests can be performed using this portable in-vehicle alternator tester. The alternator tester relies on the engine of the vehicle to spin the alternator and does not require connecting the alternator to a alternate power source.

Figure 10:
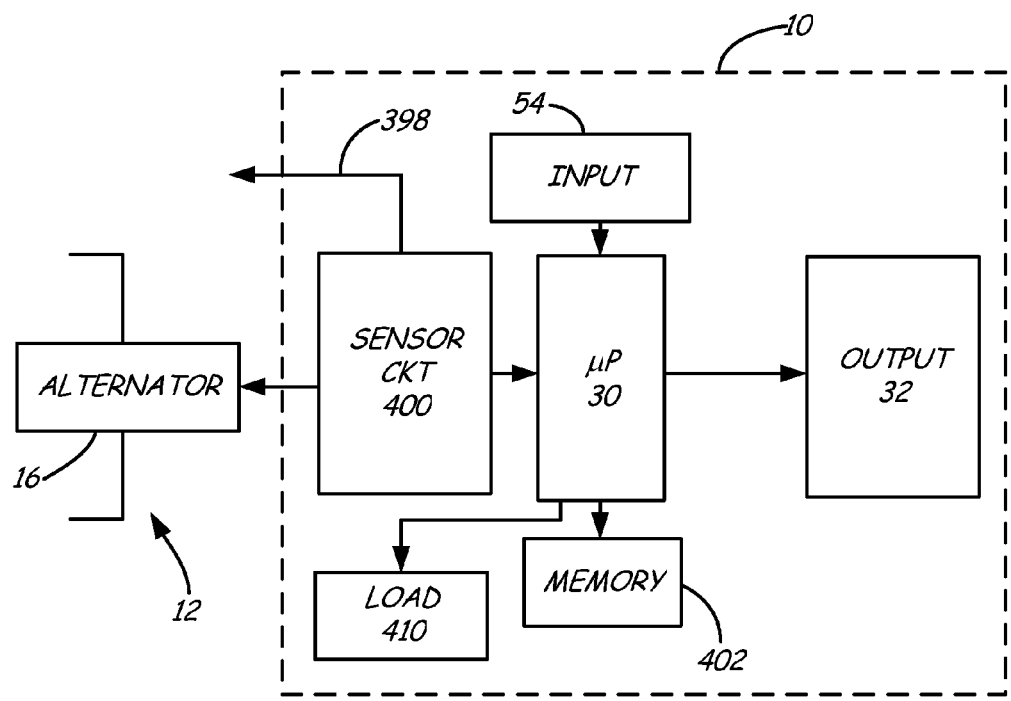
FIG. 10 is a block diagram showing another example embodiment of the present invention.

FIG. 10 is an example embodiment of tester 10 shown coupled to alternator 16 and configured to perform an in-vehicle alternator test. Tester 10 is preferably hand-held and is shown to generally include sensor circuitry 400 for coupling to alternator 16 along with auxiliary sensor or electrical connection 398. A memory 402 is also shown coupled to the microprocessor 30. During operation, the additional sensor connection 398 can be used to sense a signal related to operation of the alternator 16. The memory 402 contains data related to operator instructions for performing an alternator test as a function of vehicle type. During operation, an operator or other input can be used to provide an input to microprocessor 30 related to the type of vehicle or alternator being tested. Based upon the input data being tested. Typically, each vehicle requires a different testing procedure to test the vehicle's alternator. Microprocessor 30 recalls the appropriate operator instructions from memory 402 which are related to the testing procedures for testing the alternator 16. Steps or instructions are output on display 32 to an operator. The output can provide instructions related to the placement of sensor 398, the particular leads or connections that are required to test the alternator, or particular steps in operating the vehicle which can be used by microprocessor 30 to perform an alternator test. In some embodiments, the tester includes a plurality of test leads or connectors and operator instructions stored in the memory instruct the operator as to which one, or ones, should be used and/or how they should be connected based upon information input into the tester related to the vehicle, alternator, or engine, etc. In some embodiments, the tester 10 includes a load 410 which can be used by the microprocessor 30 to selectively apply electrical loads to the alternator 16 for use in performing the alternator test.

Figure 11:
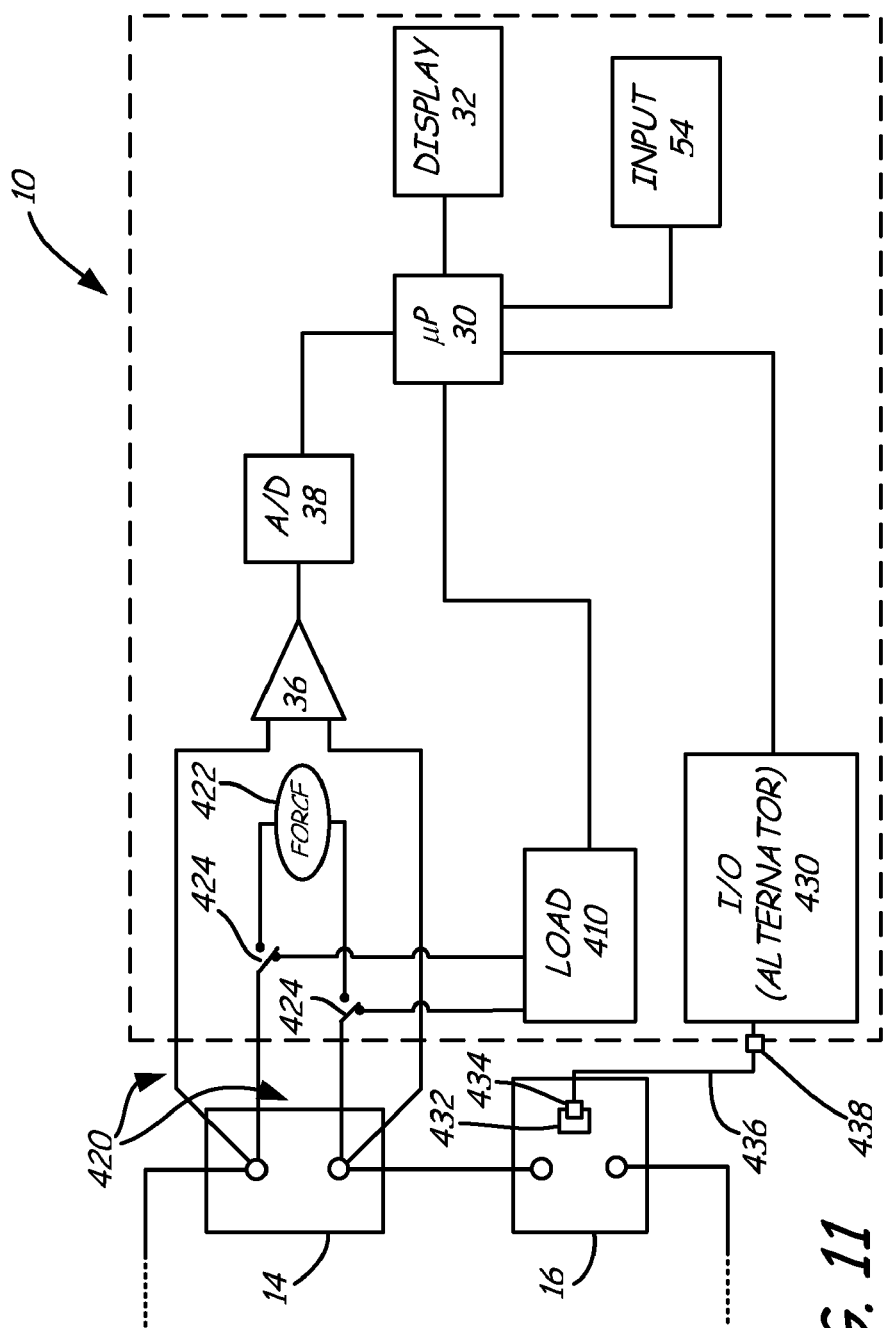
FIG. 11 is a more detailed block diagram related to the implementation of the circuitry shown in FIG. 10.

FIG. 11 is a simplified block diagram of tester 10 showing a somewhat more detailed view of the components of tester 10 used in the portable in-vehicle alternator tester of the present invention. Tester 10 includes Kelvin connections 420 configured to couple to terminals of battery 14. These Kelvin connections are used in accordance with testing techniques which employ dynamic parameters, such as those discussed above in the Champlin and Midtronics, Inc. patents. A forcing function is applied by a forcing function source 422. The forcing function is a dynamic signal which is either injected into the battery 14 or drawn from the battery 14 which has a time varying component. The conductance amplifier 36 is configured to measure the voltage across the battery and provide an output to A/D converter 38 for use by microprocessor 30. Switches 424 are configured to switch out the forcing function force 42 and switch in an internal load 410 for coupling to the electrical system of the vehicle. The load 410 can be optionally controlled by microprocessor 30. Further, microprocessor 30 controls operation of switches 424. Alternator input/output circuitry 430 is configured to connect to an access point 432 on alternator 16 through a connector 434. The specific type of access point 432 and connector 434 can vary based upon the vehicle type, the alternator type, the particular test which is desired to be performed or other factors. I/O circuitry 430 couples to microprocessor 30 and is configured to provide control signals to alternator 16 and/or sense signals generated by alternator 16. In some embodiments, access point 432 is used to connect the alternator 16 to the computer systems of the vehicle or other circuitry of the vehicle which is used to control or sense operation of the alternator 16. During an in-vehicle alternator test, this connection between the vehicle and the alternator 16 can be disconnected so that the connector 434 can be connected to access point 432 and thereby provide access to the alternator 16 by microprocessor 30. The load 410 can be of a desired size, for example the load can configured to draw less than 50 amps. In order to reduce the size of the tester 10, additional cooling components can be used to prevent the load 410 from overheating. For example, a heat sink, a fan, or other techniques can be used to cool the load 410. The wiring 436 which connects I/O circuitry 430 to connector 434 can be sufficiently long to allow an operator to be positioned at a convenient location during the alternator testing. For example, the operator can be positioned within the vehicle to control operation of the vehicle, or can be at other locations and not require to have direct access to the alternator 16 during the testing procedure.

In another example embodiment, the test circuitry 10 is configured to couple to a battery tester platform, for example through a databus. In such an implementation, the display 32 and input 54 can be implemented in the battery tester platform. Further, the microprocessor 30 may optionally be implemented in the battery tester platform. As used herein, "sensing circuitry" can include, for example, the I/O circuitry 430 and/or conductance amplifier 36, analog to digital converter 38 or other circuitry. Further, an auxiliary sensor is provided, for example, by the I/O circuitry 430, amplifier 36 or other circuitry and can comprise voltage, current, frequency, ripple, phase or other types of techniques.

During operation, tester 10 is used to perform an in-vehicle alternator test which allows pin point determination of alternator failure. For example, the pin point testing can be initiated by an operator, or automatically, upon the detection of a problematic alternator using the techniques discussed above. A particular cable 36 and connector 34 is required for a particular vehicle and/or alternator type. For example, the microprocessor 30 can receive an input through input 54 which provides information related to the vehicle and/or alternator type or other information. Based upon this information, the microprocessor 30 accesses a database contained in memory, for example internal memory or memory 402 shown in FIG. 10 and retrieves information related to a particular cable type for testing the selected alternator/vehicle. The operator is then instructed, for example using display 32 to select the appropriate cable and plug the cable into connector 438 for coupling to I/O circuitry 430. The operator can be further instructed regarding the proper placement of the cable for the test procedure. For example, the connector 434 can be connected to access point 432 of alternator 16. The display 32 can be further used to instruct the operator to start the engine of the vehicle or take other steps for use in the testing sequence. During a testing sequence, depending on the particular type of access point 432, the microprocessor 30 can access the lamp circuit, field terminals, diode trio, "S-terminal", control electronics, or other circuitry or electrical connections within alternator 16. Further, in some configurations the microprocessor 30 can control operation of the alternator 16 for example to increase the voltage provided by the alternator 16, and the resultant change in operation of the alternator can be monitored for diagnostics purposes. If the test determines that the alternator has failed or is in the process of failing, a database stored in memory can be used to suggest a replacement alternator part number. The result of the alternator test can be provided in the form of an audit code such as that discussed above. The cabling 436 can include an internal voltage regulator to test alternators of the type which use external regulators. Further, such circuitry can be implemented in the I/O circuitry 430.

The particular testing procedure set forth with regard to FIG. 10 can be initiated on its own, or it can be initiated based upon the results of the alternator test described above. After performing the alternator test, the microprocessor 30 can provide an output related to operation of the alternator 16, for example, whether a diode, field, stator, diode trio or other component has failed. The additional sensor connection can be used to sense operation of a lamp circuit, a sense circuit, ignition of the vehicle, the field of the alternator, the stator connector of the alternator, the ground of the alternator or vehicle, the B+ connection of the alternator, or other aspects of the alternator or electrical system. Depending on the type of vehicle or alternator, any number of connections can be used. In various aspects, the tester 10 is implemented in a portable tester. In some embodiments, a battery test can be included in the testing operation and performed by microprocessor 30 using the techniques discussed above. In one embodiment, a small internal load is employed which loads the electrical system to less than 50 amps of current.

Memory 402 can contain a database of information which is based upon vehicle make, model and year, alternator type, load, or other data, for example. If an alternator component is indicated as being in failure mode, or approaching failure, the memory can contain information related to an appropriate replacement part, for example by manufacturer and part number. The replacement parts can be based upon alternator type, vehicle type including model and/or year, engine type, etc. In addition to being output on a display, the results of the test can be provided in the form of an audit or test code as described above. The connection to the electrical system of the vehicle can be in the form of a universal connector configured to adapt Kelvin connections to the battery and/or alternator lead adapters. A voltage regulator can be provided to test alternators of the type which include external voltage regulators.

Although the present invention has been described with reference to preferred embodiments, workers skilled in the art will recognize that changes may be made in form and detail without departing from the spirit and scope of the invention.

What is claimed is:

1. An alternator tester for testing an alternator of a vehicle, while the alternator is coupled to the vehicle, comprising:
sensing circuitry configured to couple to an alternator while the alternator is coupled to the vehicle and configured to sense a signal related to operation of at least one component of the alternator;
a memory containing data related to operator instructions for performing a test on the alternator based on information related to vehicle type;
a processor configured to determine a condition of the alternator based on the sensed signal;
a user input configured to receive information from an operator related to the vehicle type; and
wherein the processor is further configured to provide an output indicating the condition of the at least one component of the alternator based on the sensed signal.

2. The alternator tester of claim 1 and further comprising at least one auxiliary sensor connector configured to couple the sensing circuitry to an electrical path of the at least one component of the alternator.

3. The alternator tester of claim 2 wherein the electrical path of the at least one component of the alternator comprises at least one of a lamp circuit, a sense circuit, ignition wiring, field wiring, stator wiring, ground wiring and B+ wiring of the alternator.

4. The alternator tester of claim 1 wherein the at least one component of the alternator comprises one of a regulator, diode, diode trio, field and stator.

5. The alternator tester of claim 2 wherein the at least one auxiliary sensor connector comprises a universal connector configured to accept Kelvin battery leads and alternator lead adaptors.

6. The alternator tester of claim 1 wherein the output comprises a display device.

7. The alternator tester of claim 1 wherein the memory further comprises a database of information that lists replacement parts for each component of the alternator according to the vehicle type.

8. The alternator tester of claim 1 wherein the memory further comprises a database of information that contains replacement parts for each component of the alternator according to an alternator type.

9. The alternator tester of claim 1 wherein the processor is further configured to couple to a battery tester to determine a condition of a battery coupled to the alternator.

10. The alternator tester of claim 1 wherein the processor is further configured to select an electrical path from a plurality of electrical paths to couple to the sensing circuitry based on the vehicle type.

11. The alternator tester of claim 1 wherein the processor is further configured to generate an encrypted code based on the condition of the at least one component of the alternator. adapters.

12. The alternator tester of claim 2 wherein the auxiliary sensor connector comprises a voltage regulator configured to test the alternator that has an external regulator.

13. The alternator tester of claim 1 including an electrical load configured to couple to the alternator.

14. The alternator tester of claim 1 wherein the memory contains instructions related to which connector, of a plurality of connectors, should be used by the operator for performing the alternator tests.

15. The alternator tester of claim 1 wherein the memory contains instructions related to the placement of a connector for the test procedure.

16. An alternator tester for testing an alternator of a vehicle, while the alternator is coupled to the vehicle, comprising:
   sensing circuitry configured to couple to an alternator while the alternator is coupled to the vehicle and configured to sense a signal related to operation of at least one component of the alternator;
   a memory containing data related to operator instructions for performing a test on the alternator based on information related to vehicle type;
   a processor configured to determine a condition of the alternator based on the sensed signal;
   a user input configured to receive information from an operator related to the vehicle type; and
   wherein the at least one component of the alternator comprises one of a regulator, diode, diode trio, field and stator.

17. An alternator tester for testing an alternator of a vehicle, while the alternator is coupled to the vehicle, comprising:
   sensing circuitry configured to couple to an alternator while the alternator is coupled to the vehicle and configured to sense a signal related to operation of at least one component of the alternator;
   a memory containing data related to operator instructions for performing a test on the alternator based on information related to vehicle type;
   a processor configured to determine a condition of the alternator based on the sensed signal;
   a user input configured to receive information from an operator related to the vehicle type;
   further comprising at least one auxiliary sensor connector configured to couple the sensing circuitry to an electrical path of the at least one component of the alternator; and
   wherein the at least one auxiliary sensor connector comprises a universal connector configured to accept Kelvin battery leads and alternator lead adapters.

18. An alternator tester for testing an alternator of a vehicle, while the alternator is coupled to the vehicle, comprising:
   sensing circuitry configured to couple to an alternator while the alternator is coupled to the vehicle and configured to sense a signal related to operation of at least one component of the alternator;
   a memory containing data related to operator instructions for performing a test on the alternator based on information related to vehicle type;
   a processor configured to determine a condition of the alternator based on the sensed signal;
   a user input configured to receive information from an operator related to the vehicle type; and
   wherein the memory further comprises a database of information that lists replacement parts for each component of the alternator according to the vehicle type.

19. An alternator tester for testing an alternator of a vehicle, while the alternator is coupled to the vehicle, comprising:
   sensing circuitry configured to couple to an alternator while the alternator is coupled to the vehicle and configured to sense a signal related to operation of at least one component of the alternator;
   a memory containing data related to operator instructions for performing a test on the alternator based on information related to vehicle type;
   a processor configured to determine a condition of the alternator based on the sensed signal;
   a user input configured to receive information from an operator related to the vehicle type; and
   wherein the memory further comprises a database of information that contains replacement parts for each component of the alternator according to an alternator type.

20. An alternator tester for testing an alternator of a vehicle, while the alternator is coupled to the vehicle, comprising:
   sensing circuitry configured to couple to an alternator while the alternator is coupled to the vehicle and configured to sense a signal related to operation of at least one component of the alternator;
   a memory containing data related to operator instructions for performing a test on the alternator based on information related to vehicle type;
   a processor configured to determine a condition of the alternator based on the sensed signal;
   a user input configured to receive information from an operator related to the vehicle type; and
   wherein the processor is further configured to couple to a battery tester to determine a condition of a battery coupled to the alternator.

21. An alternator tester for testing an alternator of a vehicle, while the alternator is coupled to the vehicle, comprising:
   sensing circuitry configured to couple to an alternator while the alternator is coupled to the vehicle and configured to sense a signal related to operation of at least one component of the alternator;

a memory containing data related to operator instructions for performing a test on the alternator based on information related to vehicle type;

a processor configured to determine a condition of the alternator based on the sensed signal;

a user input configured to receive information from an operator related to the vehicle type; and wherein the processor is further configured to select an electrical path from a plurality of electrical paths to couple to the sensing circuitry based on the vehicle type.

22. An alternator tester for testing an alternator of a vehicle, while the alternator is coupled to the vehicle, comprising:

sensing circuitry configured to couple to an alternator while the alternator is coupled to the vehicle and configured to sense a signal related to operation of at least one component of the alternator;

a memory containing data related to operator instructions for performing a test on the alternator based on information related to vehicle type;

a processor configured to determine a condition of the alternator based on the sensed signal;

a user input configured to receive information from an operator related to the vehicle type; and wherein the processor is further configured to generate an encrypted code based on the condition of the at least one component of the alternator.

23. An alternator tester for testing an alternator of a vehicle, while the alternator is coupled to the vehicle, comprising:

sensing circuitry configured to couple to an alternator while the alternator is coupled to the vehicle and configured to sense a signal related to operation of at least one component of the alternator;

a memory containing data related to operator instructions for performing a test on the alternator based on information related to vehicle type;

a processor configured to determine a condition of the alternator based on the sensed signal;

a user input configured to receive information from an operator related to the vehicle type;

further comprising at least one auxiliary sensor connector configured to couple the sensing circuitry to an electrical path of the at least one component of the alternator; and wherein the auxiliary sensor connector comprises a voltage regulator configured to test the alternator that has an external regulator.

24. An alternator tester for testing an alternator of a vehicle, while the alternator is coupled to the vehicle, comprising:

sensing circuitry configured to couple to an alternator while the alternator is coupled to the vehicle and configured to sense a signal related to operation of at least one component of the alternator;

a memory containing data related to operator instructions for performing a test on the alternator based on information related to vehicle type;

a processor configured to determine a condition of the alternator based on the sensed signal;

a user input configured to receive information from an operator related to the vehicle type; and including an electrical load configured to couple to the alternator.

25. An alternator tester for testing an alternator of a vehicle, while the alternator is coupled to the vehicle, comprising:

sensing circuitry configured to couple to an alternator while the alternator is coupled to the vehicle and configured to sense a signal related to operation of at least one component of the alternator;

a memory containing data related to operator instructions for performing a test on the alternator based on information related to vehicle type;

a processor configured to determine a condition of the alternator based on the sensed signal;

a user input configured to receive information from an operator related to the vehicle type; and wherein the memory contains instructions related to which connector, of a plurality of connectors, should be used by the operator for performing the alternator tests.

26. An alternator tester for testing an alternator of a vehicle, while the alternator is coupled to the vehicle, comprising:

sensing circuitry configured to couple to an alternator while the alternator is coupled to the vehicle and configured to sense a signal related to operation of at least one component of the alternator;

a memory containing data related to operator instructions for performing a test on the alternator based on information related to vehicle type;

a processor configured to determine a condition of the alternator based on the sensed signal;

a user input configured to receive information from an operator related to the vehicle type; and wherein the memory contains instructions related to the placement of a connector for a test procedure.

* * * * *

UNITED STATES PATENT AND TRADEMARK OFFICE
CERTIFICATE OF CORRECTION

PATENT NO.         : 7,246,015 B2
APPLICATION NO. : 10/864904
DATED                 : July 17, 2007
INVENTOR(S)       : Bertness It is certified that error appears in the above-identified patent and that said Letters Patent is hereby corrected as shown below:

Under Page 5 of the References cited: Col 2
Change "Search Report Under Section 17" for Great Britain Application No. GB0421447.7. (Jan. 28, 2005)." To --"Search Report Under Section 17" for Great Britain Application No. GB0421447.4. (Jan. 28, 2005).--

Col. page 5 insert
--Cite reference "Notification of Transmittal of The International Search Report or the Declaration", PCT/US03/07546."--

Col. 19, Line 4: Change "adaptors." To --adapters.--

Col. 19, Line 25: Delete "adapters."

Signed and Sealed this

Eleventh Day of December, 2007

JON W. DUDAS
*Director of the United States Patent and Trademark Office*